US007916555B2

(12) United States Patent
Nakamura et al.

(10) Patent No.: US 7,916,555 B2
(45) Date of Patent: *Mar. 29, 2011

(54) SEMICONDUCTOR INTEGRATED CIRCUIT ADAPTED TO OUTPUT PASS/FAIL RESULTS OF INTERNAL OPERATIONS

(75) Inventors: Hiroshi Nakamura, Fujisawa (JP); Kenichi Imamiya, Tokyo (JP); Toshio Yamamura, Yokohama (JP); Koji Hosono, Yokohama (JP); Koichi Kawai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 236 days.

This patent is subject to a terminal disclaimer.

(21) Appl. No.: 12/252,896

(22) Filed: Oct. 16, 2008

(65) Prior Publication Data
US 2009/0080264 A1 Mar. 26, 2009

Related U.S. Application Data

(60) Continuation of application No. 11/742,600, filed on May 1, 2007, now Pat. No. 7,453,739, which is a continuation of application No. 11/515,005, filed on Sep. 5, 2006, now Pat. No. 7,224,621, which is a continuation of application No. 11/119,744, filed on May 3, 2005, now Pat. No. 7,123,515, which is a division of application No. 10/318,167, filed on Dec. 13, 2002, now Pat. No. 7,023,741.

(30) Foreign Application Priority Data

Dec. 19, 2001 (JP) .................................. 2001-386596
Oct. 25, 2002 (JP) .................................. 2002-311475

(51) Int. Cl.
G11C 7/10 (2006.01)
(52) U.S. Cl. ........ 365/189.05; 365/185.22; 365/189.011
(58) Field of Classification Search ............. 365/189.05, 365/185.22, 189.011
See application file for complete search history.

(56) References Cited

U.S. PATENT DOCUMENTS

| 5,640,351 A | 6/1997 | Yabe et al. |
| 5,812,457 A | 9/1998 | Arase |
| 5,881,006 A | 3/1999 | Yabe et al. |
| 5,956,349 A | 9/1999 | Watanabe et al. |
| 5,983,313 A | 11/1999 | Heisler et al. |
| 6,208,563 B1 | 3/2001 | Naritake |
| 6,259,628 B1 | 7/2001 | Park |
| 6,282,121 B1 | 8/2001 | Cho et al. |
| 6,466,491 B2 | 10/2002 | Yanagawa |
| 6,671,204 B2 | 12/2003 | Im |
| 6,834,322 B2 * | 12/2004 | Sukegawa ..................... 711/103 |
| 6,937,510 B2 | 8/2005 | Hosono et al. |
| 2002/0126531 A1 | 9/2002 | Hosono et al. |

FOREIGN PATENT DOCUMENTS

CN 1279482 A 1/2001

(Continued)

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

In a semiconductor integrated circuit, an internal circuit is capable of executing a first operation and a second operation concurrently, and an output circuit outputs to the outside of the semiconductor integrated circuit information indicating whether or not the first operation is being executed and information indicating whether or not the second operation is executable.

24 Claims, 35 Drawing Sheets

FOREIGN PATENT DOCUMENTS

| | | |
|---|---|---|
| JP | 63-239696 | 10/1988 |
| JP | 11-86580 | 3/1999 |
| JP | 2001-14888 | 1/2001 |
| JP | 2001-35172 | 2/2001 |
| JP | 2001-273798 | 10/2001 |
| JP | 2001-325796 | 11/2001 |

* cited by examiner

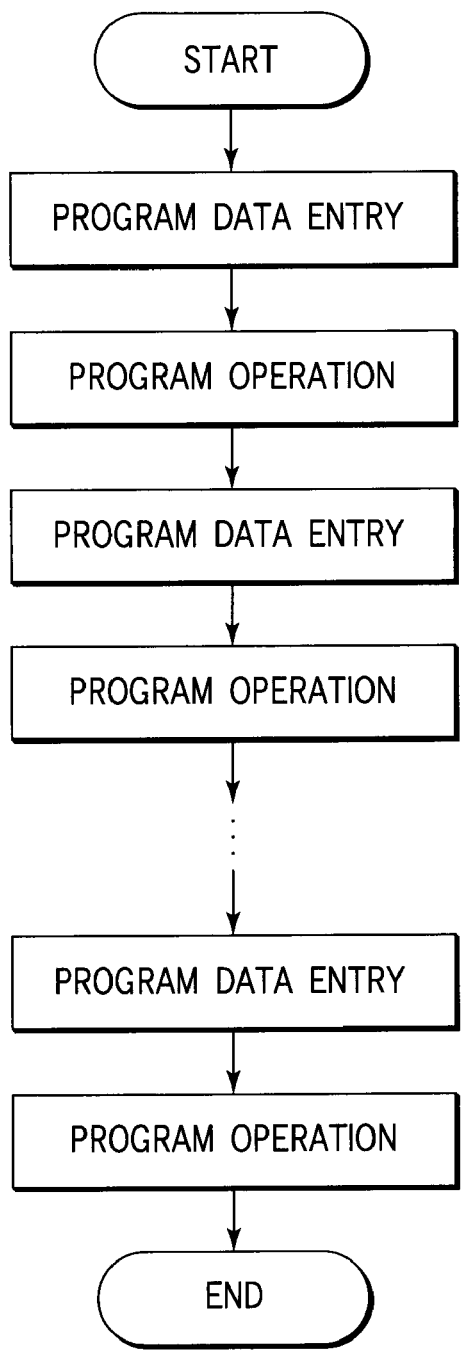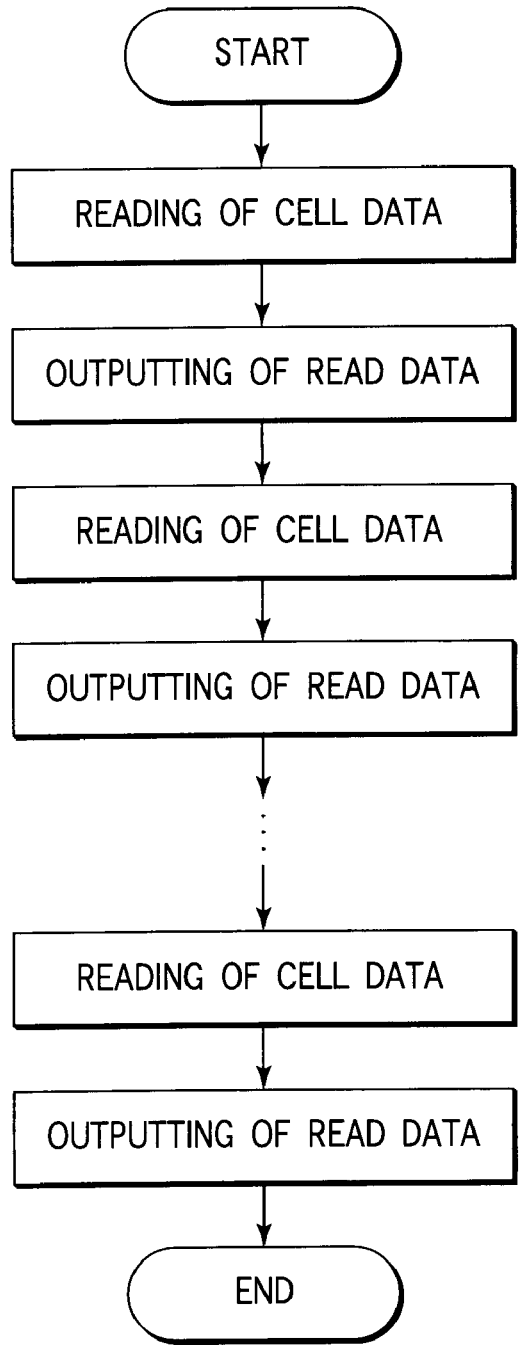
FIG. 2 PRIOR ART
FIG. 3 PRIOR ART

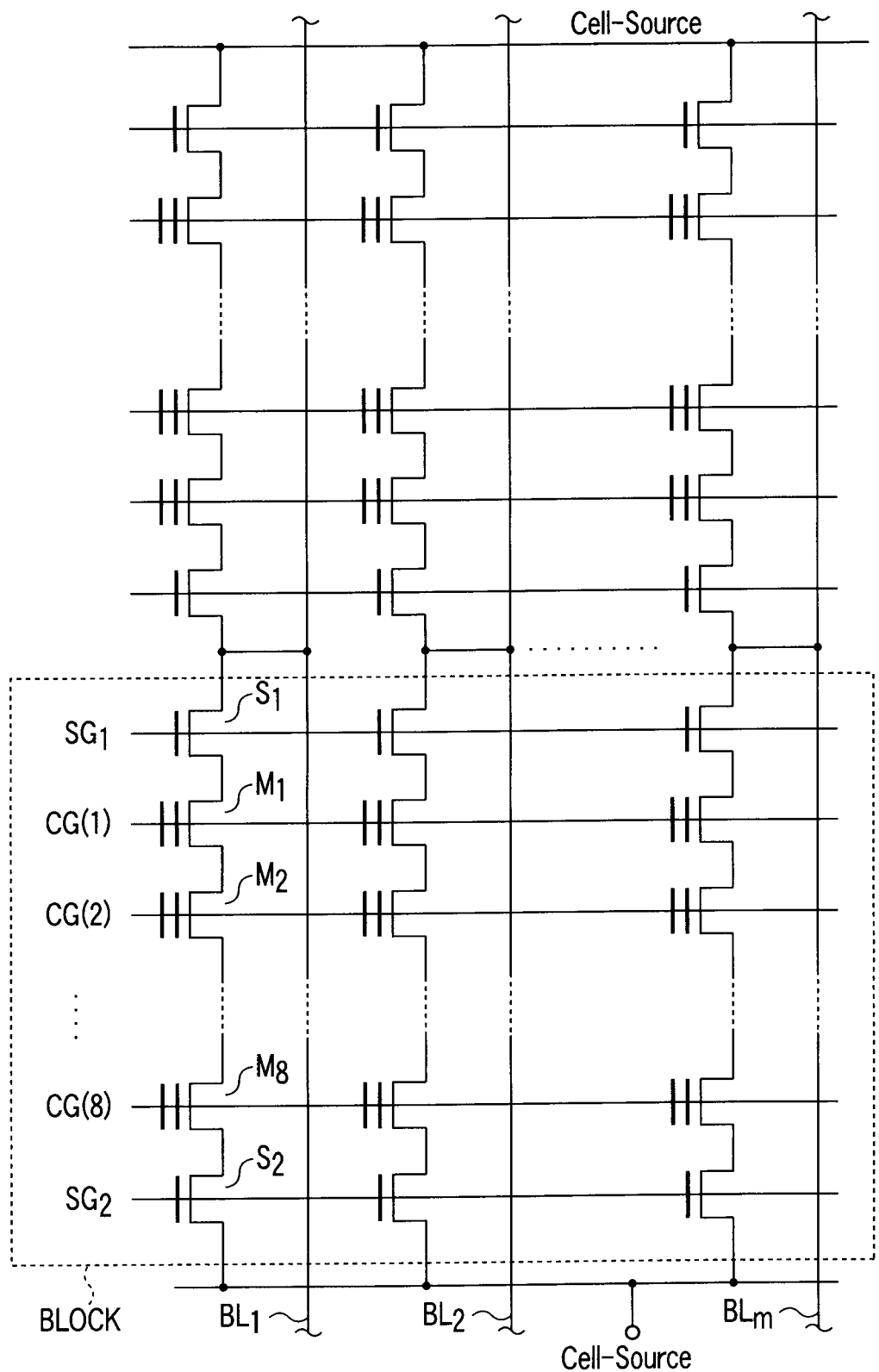
F I G. 7

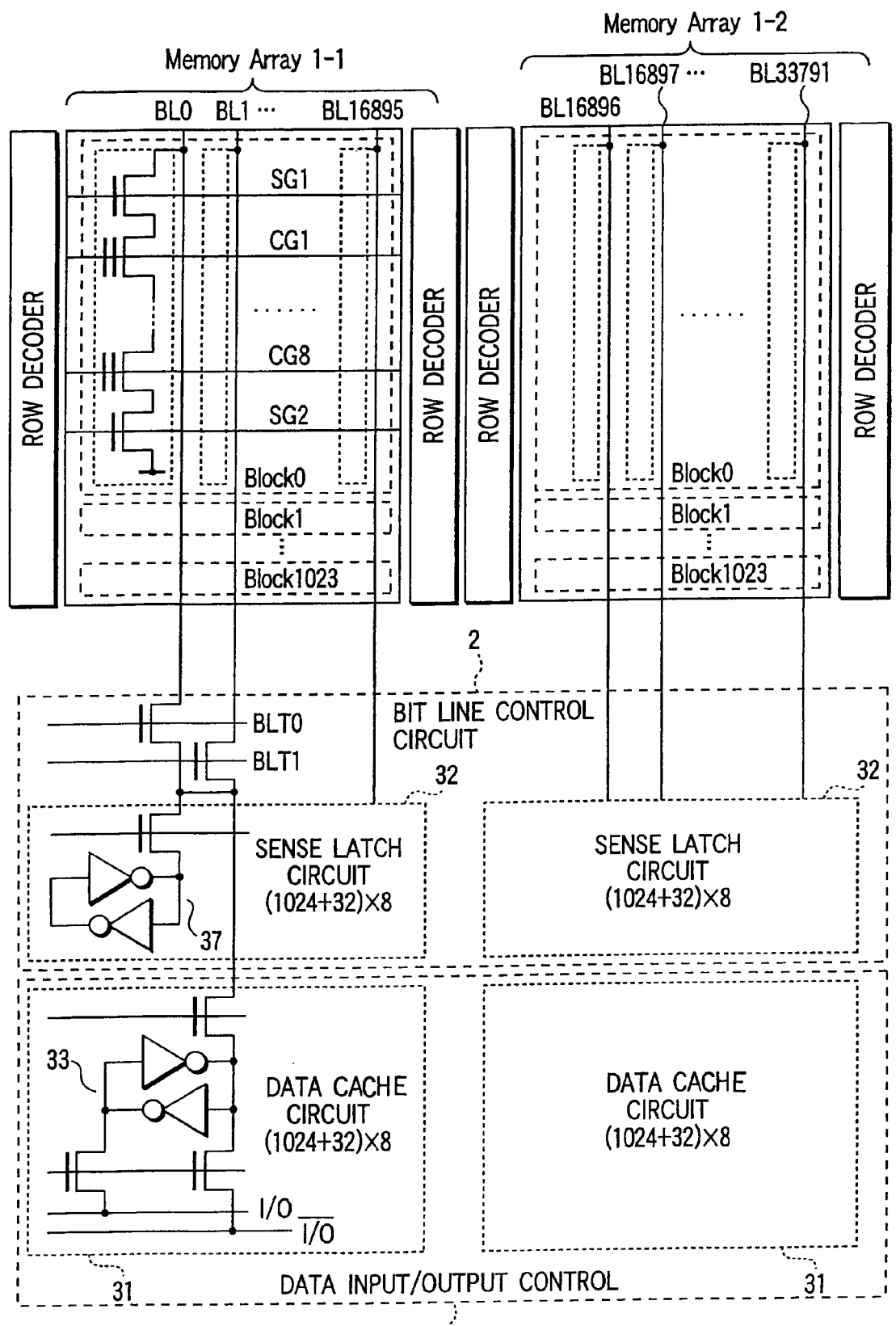
F I G. 12

"COM1-add-Data-COM3" OPERATION

"COM1-add-Data-COM2" + "COM1-add-Data-COM3" NPUT-1

"COM1-add-Data-COM2" + "COM1-add-Data-COM3" INPUT-2

"COM1-add-Data-COM2" + "COM1-add-Data-COM2" INPUT-1

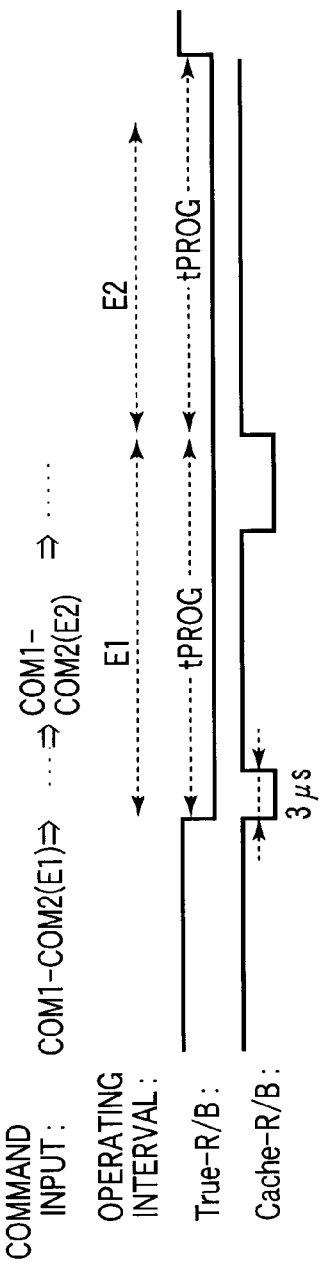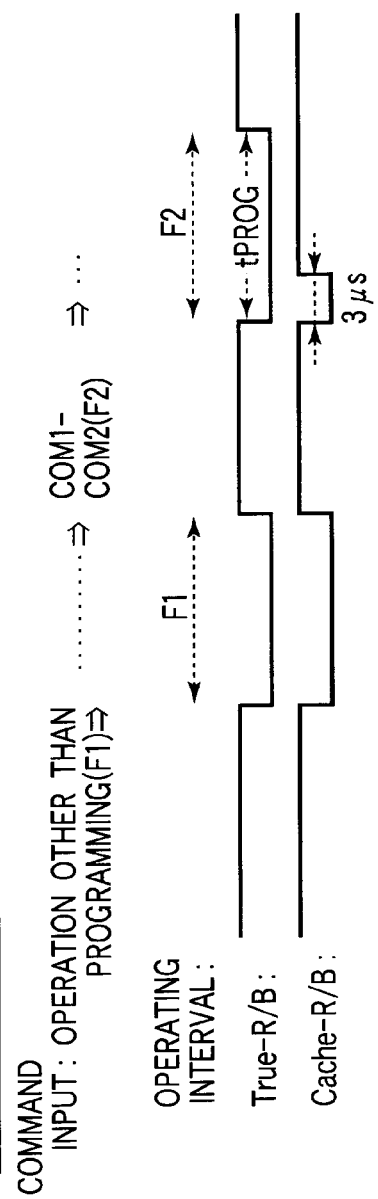

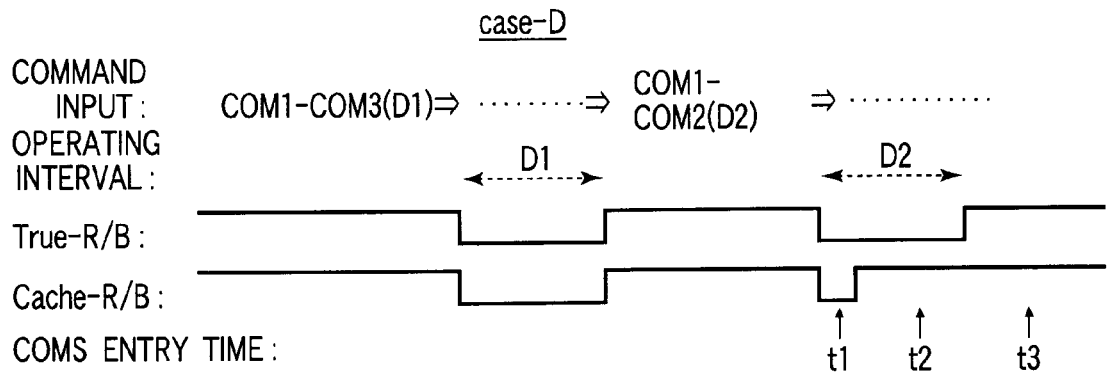
F I G. 16D
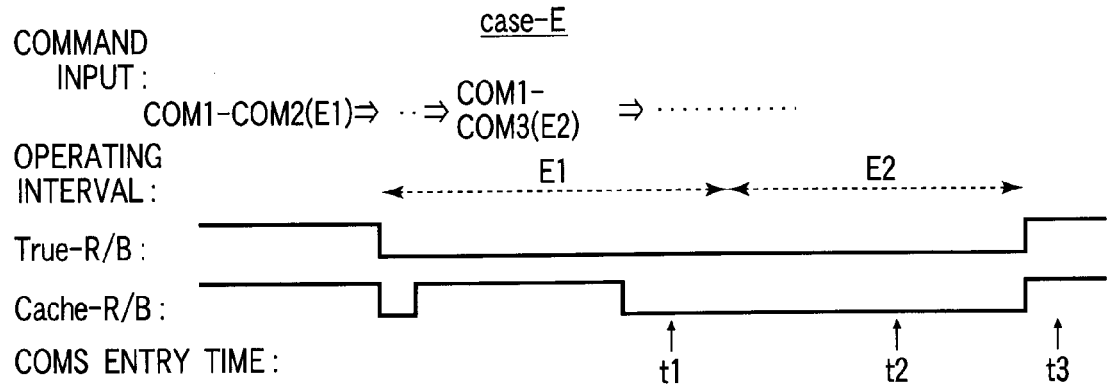
F I G. 16E
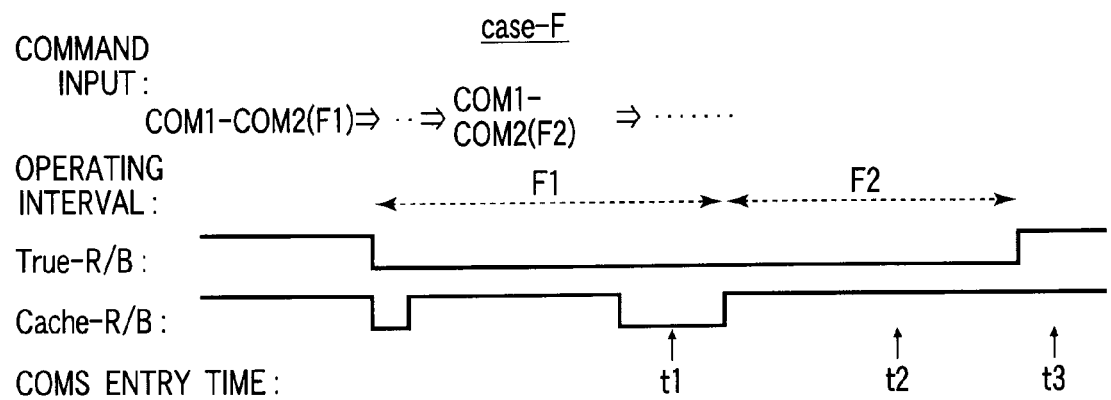
F I G. 16F

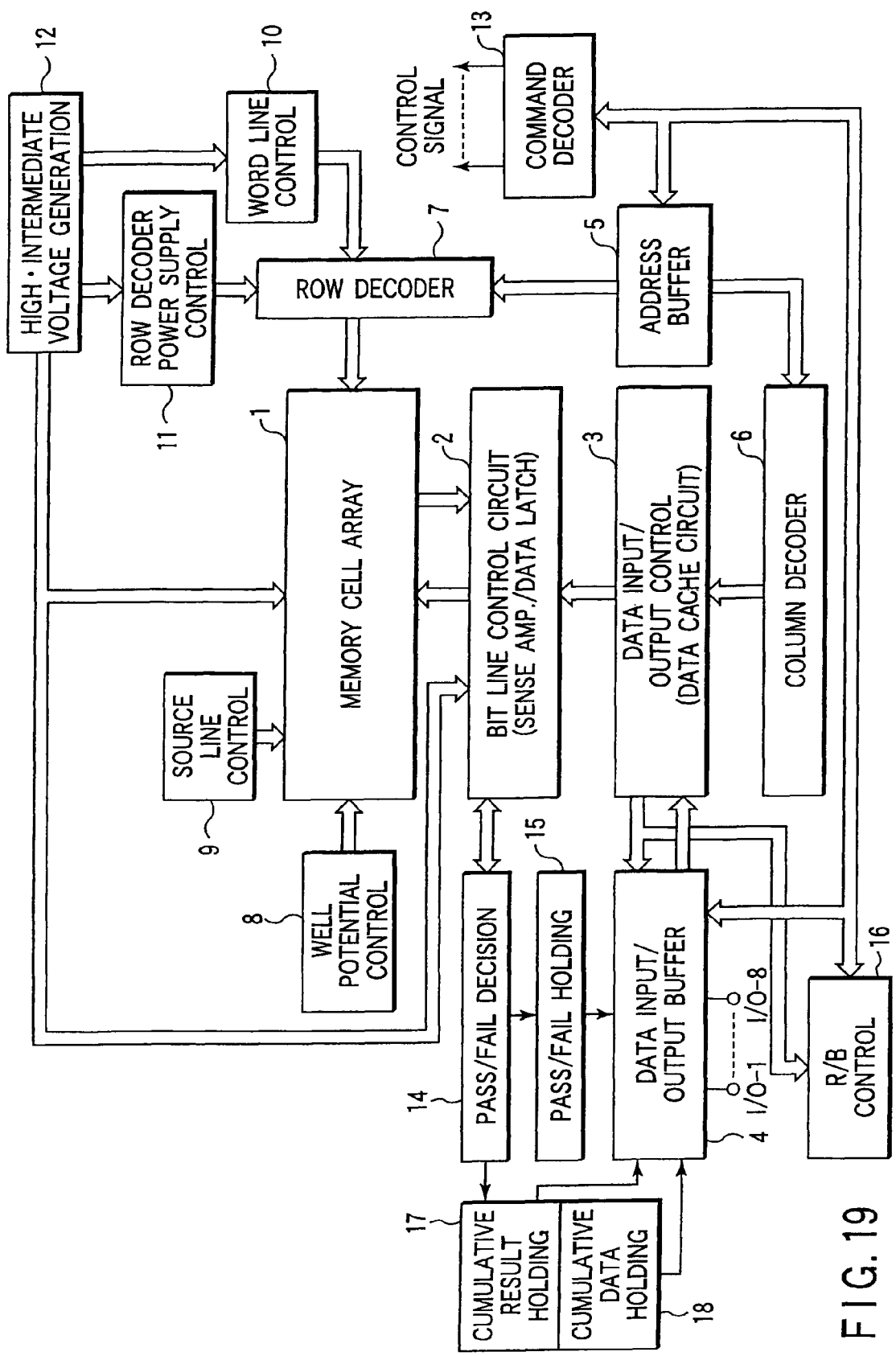
F I G. 19

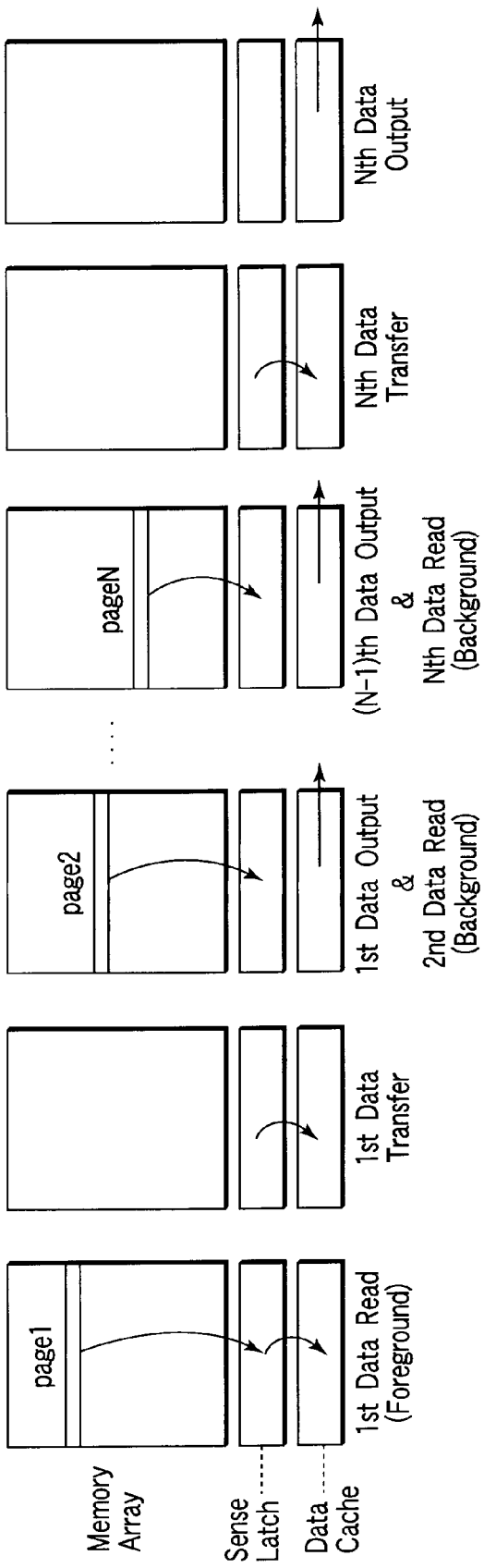

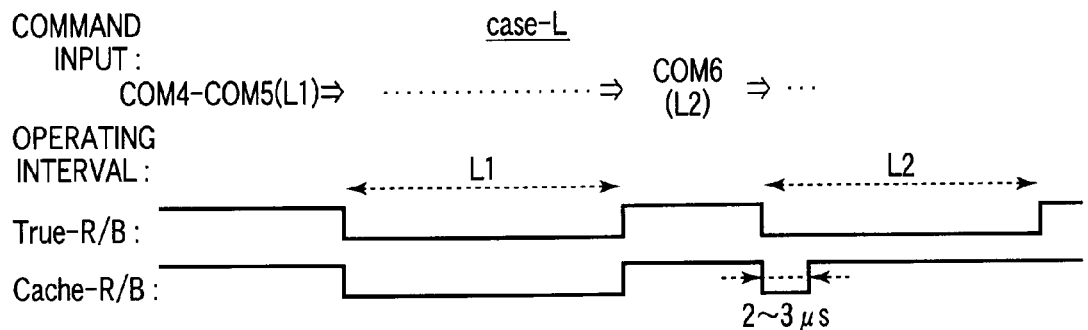
F I G. 23A
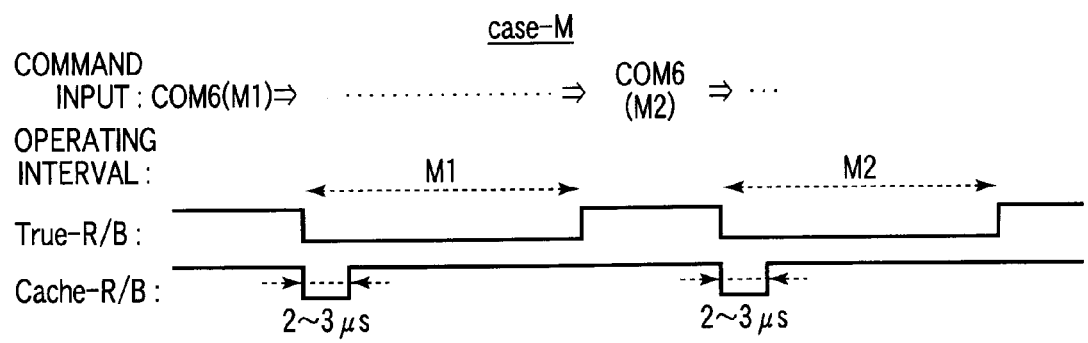
F I G. 23B
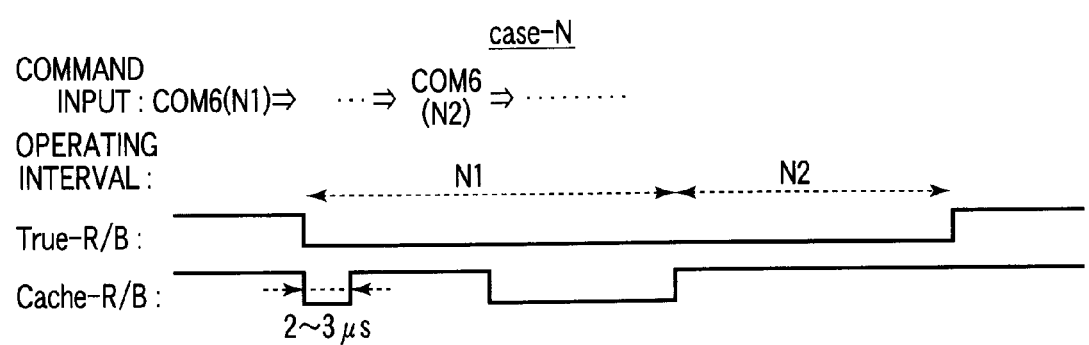
F I G. 23C
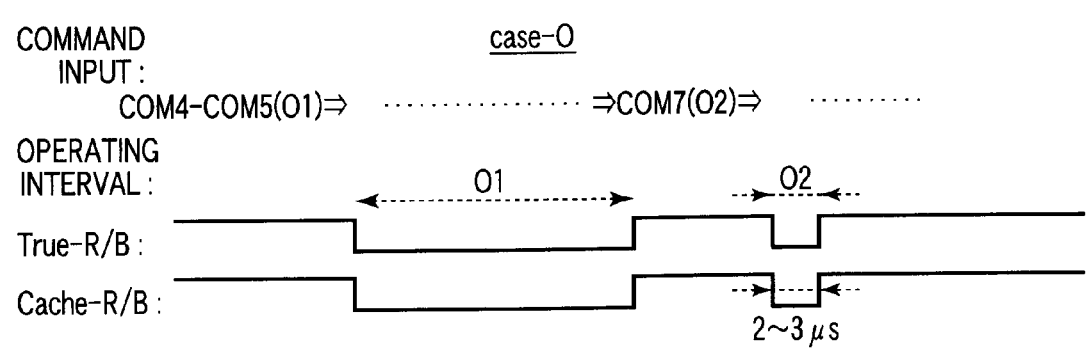
F I G. 23D

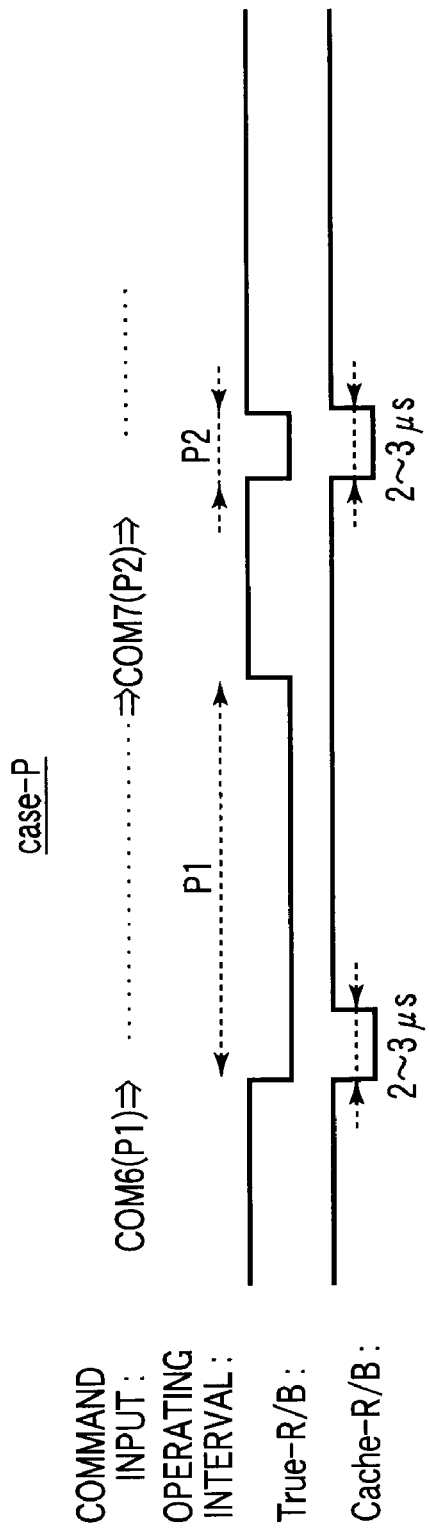
F I G. 23E
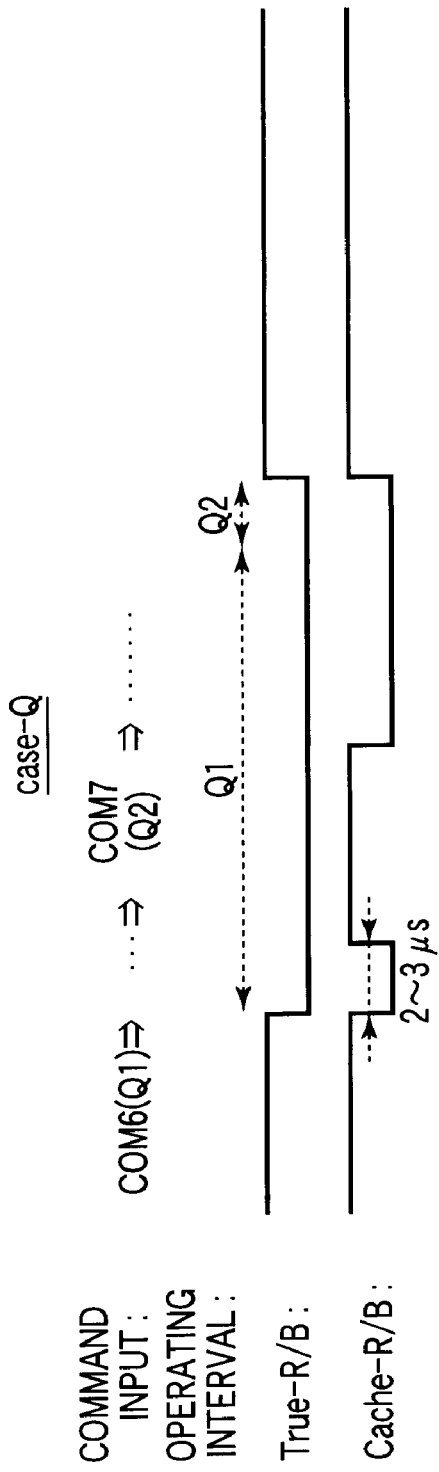
F I G. 23F

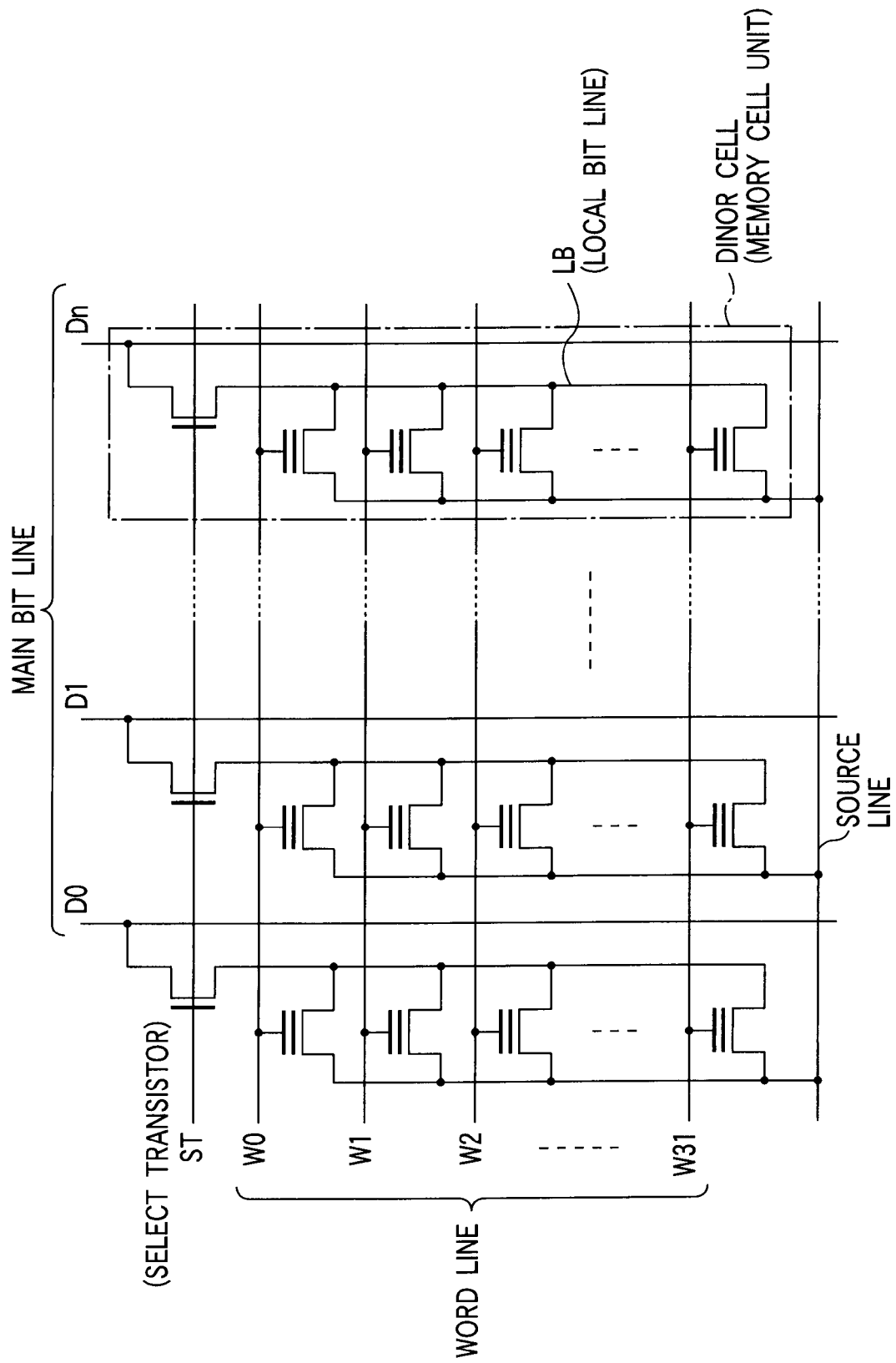
F I G. 26

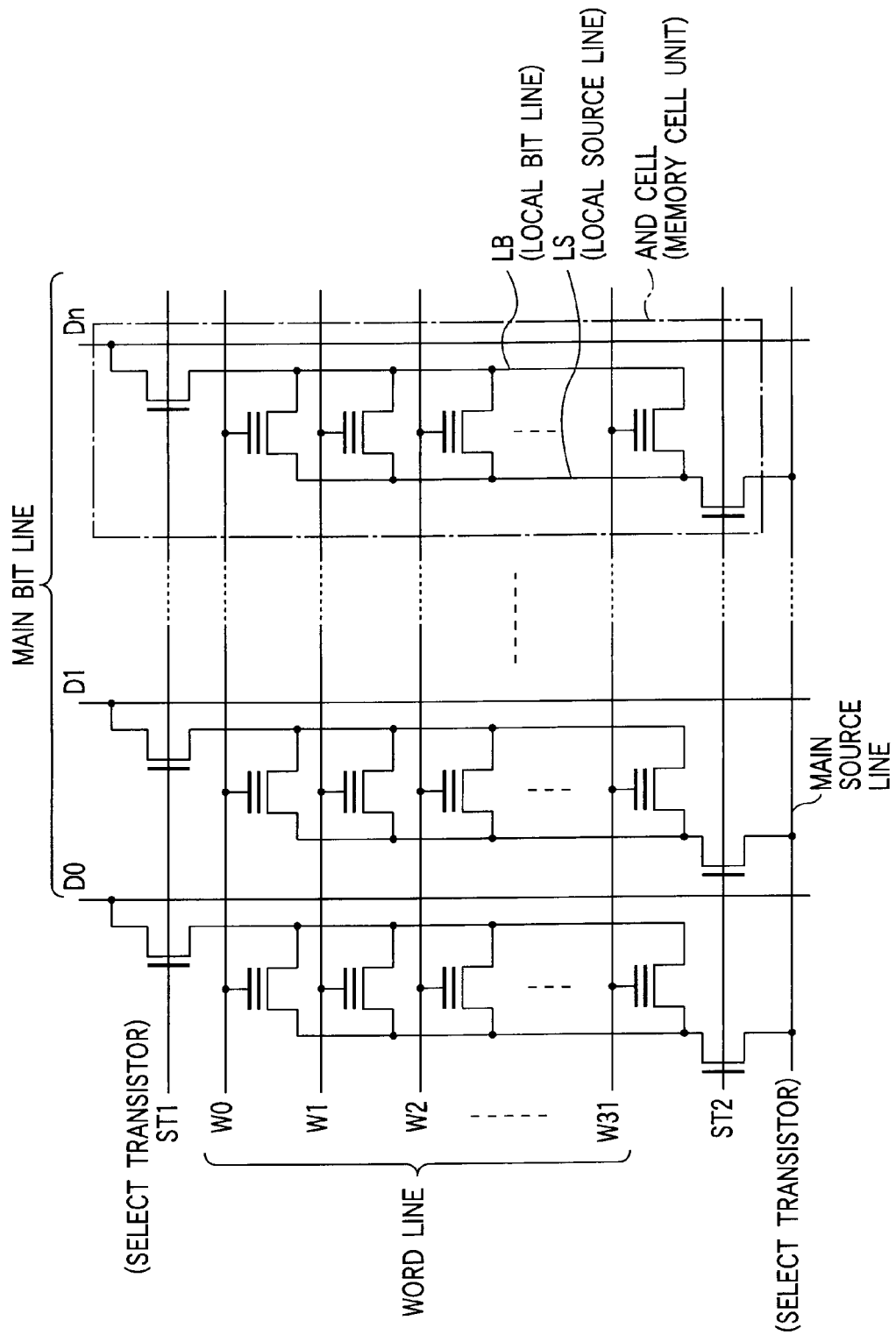
F I G. 27

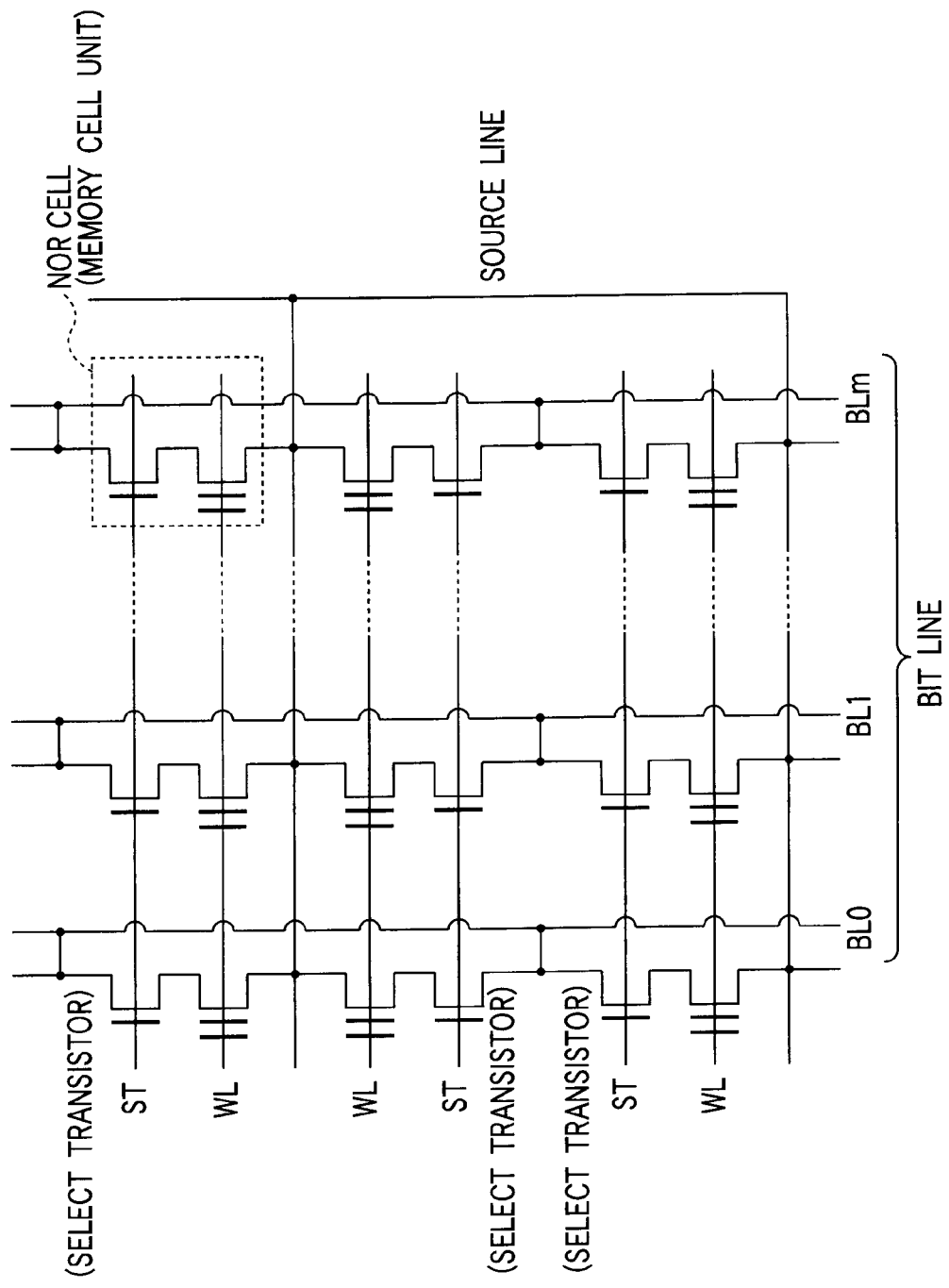
F I G. 28

SEMICONDUCTOR INTEGRATED CIRCUIT ADAPTED TO OUTPUT PASS/FAIL RESULTS OF INTERNAL OPERATIONS

CROSS-REFERENCE TO RELATED APPLICATIONS

This application is a continuation of, and claims the benefit of priority under 35 USC §120 from, U.S. application Ser. No. 11/742,600, filed May 1, 2007 (now U.S. Pat. No. 7,453,739), which is a continuation of U.S. application Ser. No. 11/515,005, filed Sep. 5, 2006 (now U.S. Pat. No. 7,224,621), which is a continuation of U.S. application Ser. No. 11/119,744, filed May 3, 2005 (now U.S. Pat. No. 7,123,515B2), which is a divisional of U.S. application Ser. No. 10/318,167, filed Dec. 13, 2002 (now U.S. Pat. No. 7,023,741B2), and is based upon and claims the benefit of priority under 35 USC §119 from the Japanese Patent Applications No. 2001-386596, filed Dec. 19, 2001, and No. 2002-311475, filed Oct. 25, 2002, the entire contents of all of which are incorporated herein by reference.

BACKGROUND OF THE INVENTION

1. Field of the Invention

The present invention relates to a semiconductor integrated circuit adapted to output the PASS/FAIL results of internal operations to the outside of the semiconductor chip. Specifically, the present invention relates to a nonvolatile semiconductor storage device, such as a NAND-cell EEPROM, a NOR-cell EEPROM, a DINOR-cell EEPROM, or an AND-cell EEPROM.

2. Description of the Related Art

An electrically rewritable EEPROM is known as one type of semiconductor storage device. In particular, a NAND-cell-based EEPROM in which a plurality of memory cells are connected in series to form a NAND cell block has attracted a great deal of attention because of its adaptability for high packing densities.

One memory cell in the NAND-cell-based EEPROM has an FET-MOS structure in which a floating gate (charge storage layer) and a control gate are formed over the semiconductor substrate such that the former is located below the latter with an insulating film interposed therebetween. A plurality of memory cells are connected in series such that the source of each cell is common to the drain of the adjacent cell, thereby forming a NAND cell. The NAND cell is connected as a unit to a corresponding bit line.

Such NAND cells are arranged in a matrix form to constitute a memory cell array. The memory cell array is manufactured into a p-type well (or a p-type substrate). NAND cells arranged in the column direction of the memory cell array have their respective drains at their one end connected together through select gate transistors to a corresponding bit line and their respective sources at their other end connected together through select gate transistors to a common source line.

The control gates of memory cell transistors arranged in the row direction of the memory cell array are connected together to form a control gate line (word line). Likewise, the gates of the select gate transistors arranged in the row direction are connected together to form a select gate line.

The NAND-cell EEPROM operates in the following manner:

Data program operation begins with the memory cell located furthest from a bit line contact. The control gate of the selected memory cell is supplied with a high voltage Vpgm of about 18V. The control gates of the memory cells located nearer the bit line contact and the select gates are supplied with an intermediate voltage Vmw of about 10V. The bit line is supplied with 0V or an intermediate voltage of about 8V according to data.

When the bit line is supplied with 0V, the voltage is transferred to the drain of the selected memory cell, so that tunneling of electrons from the drain into the floating gate occurs. Thereby, the threshold voltage of the selected memory cell is caused to shift in the positive direction. This state is assumed to be "0" by way of example.

When the intermediate voltage Vmb is applied to the bit line, no tunneling of electrons occurs and hence the threshold voltage of the memory cell is not changed and remains negative. This state corresponds to "1".

Data erasing is performed simultaneously on all the memory cells in a selected NAND cell block. That is, all the control gates in the selected NAND cell block are set at 0V, a high voltage Vera of about 22V is applied to the p-type well (or the p-type substrate). The bit and source lines and the control gates in nonselected NAND cell blocks and all the select gate lines are rendered floating.

Thereby, in all the memory cells in the selected NAND cell block, electrons in the floating gates due to the tunnel effect are released into the p-type well (or the p-type substrate). Thereby, after erasing, the threshold voltage is shifted in the negative direction.

To read data, the control gate of the selected memory cell is set at 0V with the control gates of other memory cells and the select gates supplied with the supply voltage Vcc or a read voltage VH higher than Vcc. This read voltage VH is normally less than twice the supply voltage Vcc, say, less than 5V. In this state, data is sensed by detecting whether or not a current is flowing in the selected memory cell.

FIG. 1 shows example arrangements of the memory cell array and the bit line control circuit of a conventional NAND-cell EEPROM.

In FIG. 1, the memory cell array has 33,792 bit lines BL0 to BL33791 and 1,024 blocks Block0 to Block1023 and row decoders are placed on opposite sides of the array in the row direction.

A sense latch circuit 31 is connected between a pair of bit lines BLi and BLi+1 (i=0, 1, . . . ) and a pair of input/output lines IO and /IO over which data is transferred between the memory array and the data input/output buffer. That is, a single sense latch is connected between the paired input/output lines IO and /IO and each pair of odd- and even-numbered bit lines.

FIG. 2 shows an algorithm for the data program sequence in the NAND cell EEPROM of FIG. 1.

According to this algorithm, data is programmed into each of two or more pages in sequence. While data is being programmed in, that is, when the sense latch circuit 31 is in operation, it cannot be used for another operation, such as data entry.

That is, the data program sequence involves an operation of entering data to be programmed (program data) and an operation of programming data for one page. These operations are performed alternately for each page. That is, the data entry operation cannot be performed concurrently with the data program operation.

Thus, the data entry operation and the data program operation are repeated alternately during the data program sequence. The overall time of the data program sequence is defined mainly by the sum of the time required to enter data and the time required to program data and will therefore become considerably long.

FIG. 3 shows an algorithm for the data read sequence in the NAND-cell EEPROM of FIG. 1.

In this algorithm, each of pages is subjected in sequence to a data read operation. While data is being read, the sense latch circuit 31 is in operation (i.e., in use); thus, it cannot be used for another operation (such as outputting data).

With the algorithm of FIG. 3, the overall time of the data read sequence is determined by the sum of the time required to read data and the time required to output data and will therefore become considerably long.

With a conventional nonvolatile semiconductor storage device such as of the NAND cell type, as described above, it is impossible to perform a data entry operation concurrently with a data program operation and a problem therefore arises in that the overall time of the data program sequence becomes long.

Likewise, it is also impossible to perform a data output operation concurrently with a data read operation and a problem therefore arises in that the overall time of the data read sequence becomes long.

BRIEF SUMMARY OF THE INVENTION

According to an aspect of the present invention there is provided a semiconductor integrated circuit comprises: an internal circuit configured to execute a first operation and a second operation concurrently; and an output circuit connected to the internal circuit, the output circuit configured to output to the outside of the semiconductor integrated circuit information indicating whether or not the first operation is being executed and information indicating whether or not the second operation is executable.

BRIEF DESCRIPTION OF THE SEVERAL VIEWS OF THE DRAWING

FIG. 2 is a flowchart illustrating an algorithm for a data program sequence in the memory of FIG. 1;

FIG. 3 is a flowchart illustrating an algorithm for the data read sequence in the memory of FIG. 1;

FIG. 7 shows an equivalent circuit of a portion of the memory cell array of FIG. 4;

FIG. 12 shows a first modification of the memory cell array of the first embodiment;

FIGS. 15A through 15F are timing diagrams illustrating how the busy state is output at data program operation execution time when the data program sequences of FIGS. 14A to 14C are used;

FIGS. 16A through 16K are timing diagrams illustrating the time dependence of PASS/FAIL result outputs at status read time when program operations are performed in succession;

FIG. 19 is a block diagram of a NAND-cell EEPROM according to a third embodiment of the present invention;

FIGS. 21A through 21F are diagrams for use in explanation of the operation of the memory of FIG. 8 when the algorithm of FIG. 20 is used;

FIGS. 23A through 23F are timing diagrams illustrating the ready/busy states in data read operations when the data program sequence of FIG. 22B is used;

FIG. 26 shows an equivalent circuit of a portion of the memory cell array of a DINOR cell EEPROM;

FIG. 27 shows an equivalent circuit of a portion of the memory cell array of an AND cell EEPROM;

FIG. 28 shows an equivalent circuit of a portion of the memory cell array of an example of a NOR cell EEPROM with select transistors.

DETAILED DESCRIPTION OF THE INVENTION

Figure 1:
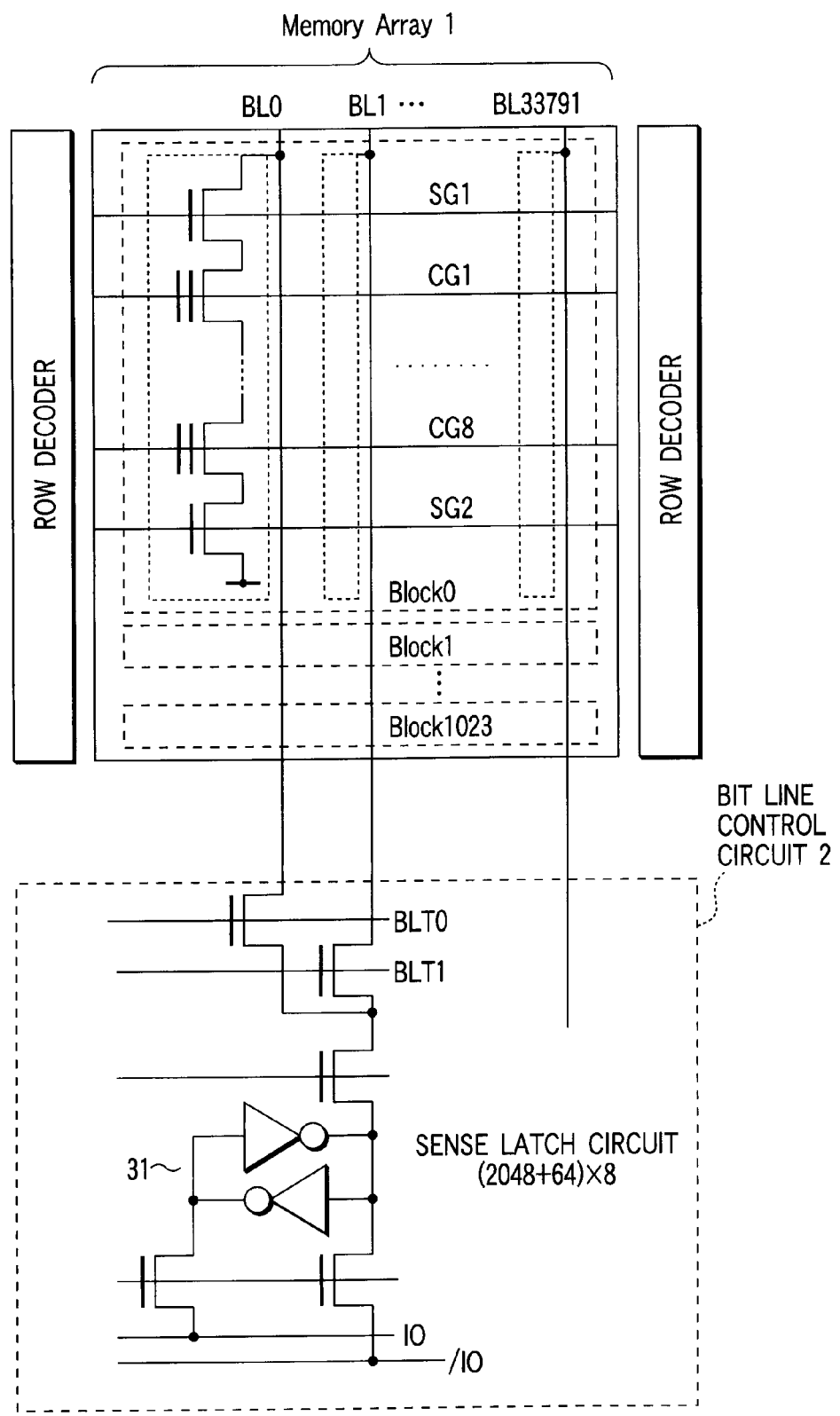
FIG. 1 shows example arrangements of the memory cell array, the bit line control circuit and the data input/output control circuit of a conventional NAND cell EEPROM.
Figure 4:
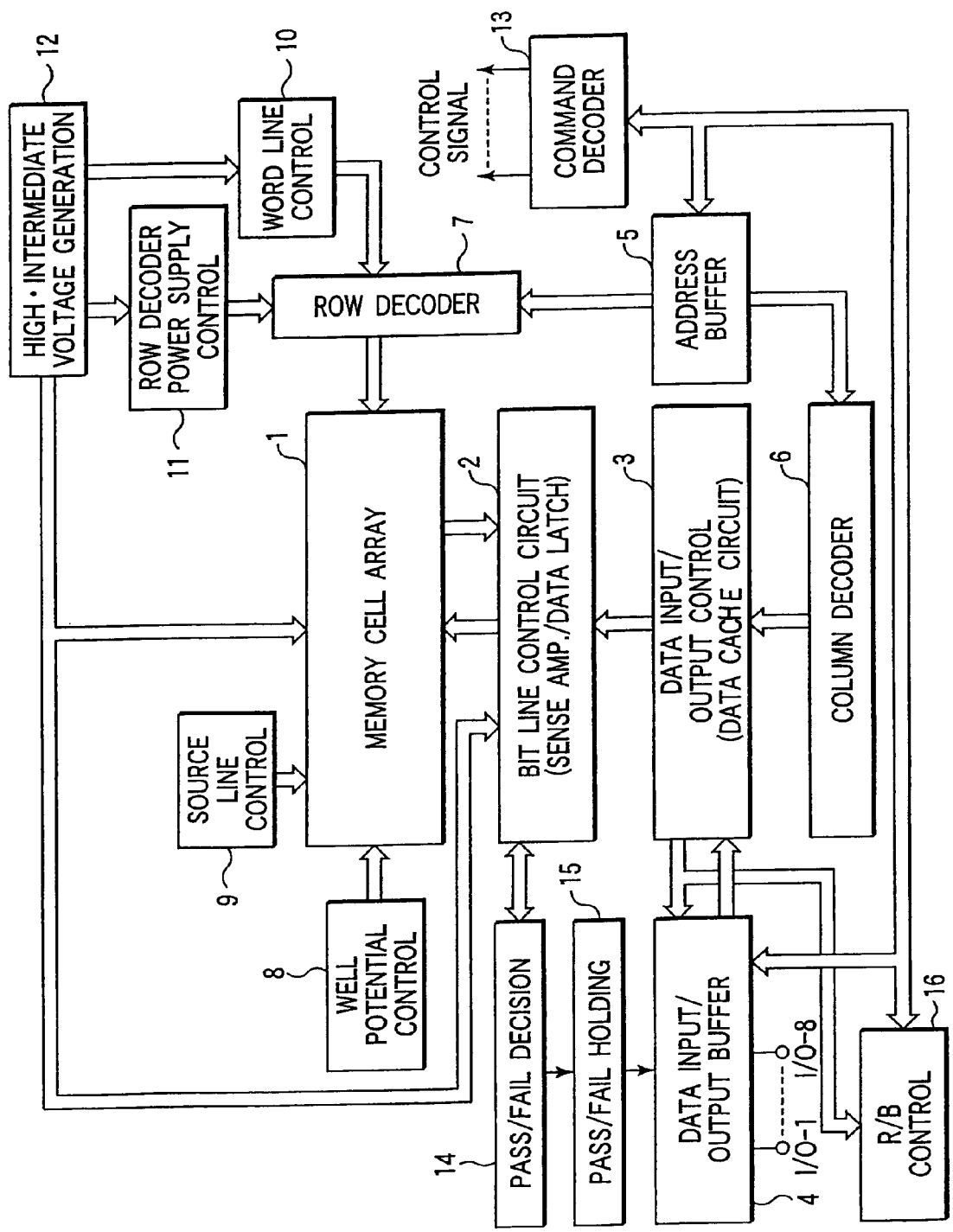
FIG. 4 is a block diagram of a NAND-cell EEPROM according to a first embodiment of the present invention.

Referring now to FIG. 4, there is illustrated, in block diagram form, an arrangement of a NAND-cell EEPROM according to a first embodiment of the present invention.

A memory cell array 1 is formed, as will be described later, with a number of memory cells each of which has a control gate and a floating gate and is associated with a bit line and a word line. The memory cells are divided into a number of blocks. In operation, one of the blocks is selected.

Connected with the memory cell array 1 is a bit line control circuit 2 which is adapted to read data from the memory cells in the array. Also, it performs a data program operation on each memory cell.

To this end, the bit line control circuit 2 includes a plurality of sense latch circuits (sense amplifier/data latch circuits) that acts as a sense amplifier for sensing and amplifying potentials on the bit lines in the cell array and data latch circuits for latching program data to be programmed. The bit line control circuit 2 receives program data from or sends read data to a data input/output control circuit 3.

As will be described later, the data input/output control circuit 3 includes a plurality of data cache circuits that holds program data or read data and performs input/output control of internal or external data. A data input/output buffer (I/O buffer) 4 is connected with the data input/output control circuit 3.

The data input/output control circuit 3 is controlled by a column decoder 6 that receives an address information from an address buffer (address latch) 5 which receives an address information input.

Connected with the memory cell array 1 is a row decoder 7 that controls the control gates of the memory cells and the select gates. Further, connected with the memory cell array 1 is a well potential control circuit 8 that controls the potential of the p-type well or p-type substrate in which the memory cell array 1 is manufactured. Moreover, connected with the memory cell array 1 is a source line control circuit 9 that controls the source line voltage.

Also, a word line control circuit 10 is provided to control the potentials on the word lines, or the control gate lines, in the selected block. A row decoder power supply control circuit 11 is provided which controls the supply voltage of the row decoder circuit 7. The word line control circuit 10 and the row decoder power supply control circuit 11 are both connected to the row decoder circuit 7.

Furthermore, a high voltage/intermediate voltage generating circuit 12 is provided which generates high and intermediate program voltages, a high erase voltage and a high read voltage. The erase voltage is applied to the p-type well or p-type substrate during an erase operation. The program voltages are applied to the word line, the bit lines, the row decoder 7, etc., during a program operation. The voltage generating circuit 12 is connected to the memory cell array 1, the bit line control circuit 2, the word line control circuit 10, and the row decoder power supply control circuit 11.

The data input/output buffer 4 sends data to or receives data from the outside. For example, eight I/O pads I/O-1 to I/O-8 are connected to the data input/output buffer 4. Through these I/O pads the buffer 4 receives program data, address information, commands, etc., from the outside and outputs read data and various signals to the outside.

The data input/output buffer 4 is further connected to the address buffer 5 and a command decoder 13.

When a command is input to the data input/output buffer 4 through the I/O pads I/O-1 to I/O-8, the command decoder 13 receives and latches the command through the buffer 4 and then outputs control signals to control various operations such as read, program, and erase operations.

A PASS/FAIL decision circuit 14 and a PASS/FAIL holding circuit 15 are also provided. The PASS/FAIL decision circuit 14 is connected to the bit line control circuit 2 and the PASS/FAIL holding circuit 15 is connected to the PASS/FAIL decision circuit 14. The PASS/FAIL hold circuit 15 includes, for example, shift registers.

The PASS/FAIL decision circuit 14 decides whether or not the cell programming or erasing has been performed correctly. When the cell programming or erasing has been performed correctly, it is defined as the PASS status; otherwise, it is defined as the FAIL status.

After the cell programming or erasing, the result of the PASS/FAIL decision by the PASS/FAIL decision circuit 14 is sent to a PASS/FAIL holding circuit 15 and held therein. In examining the PASS/FAIL status is externally applied through the data input/output buffer 4 to the command decoder 13, which accordingly produces control signals to cause the result of the PASS/FAIL decision is then output through at least one of the I/O pads I/O-1 to I/O-8 to the outside of the chip.

Connected to the data input/output control circuit 3 and the data input/output buffer 4 is a Ready/Busy (R/B) control circuit 16, which is responsive to the data input/output control circuit 3 to produce a plurality of Ready/Busy signals indicating the current operating state of the chip. The plurality of Ready/Busy signals are output through the I/O pads I/O-1 to I/O-8 to the outside of the chip.

Figure 5A:
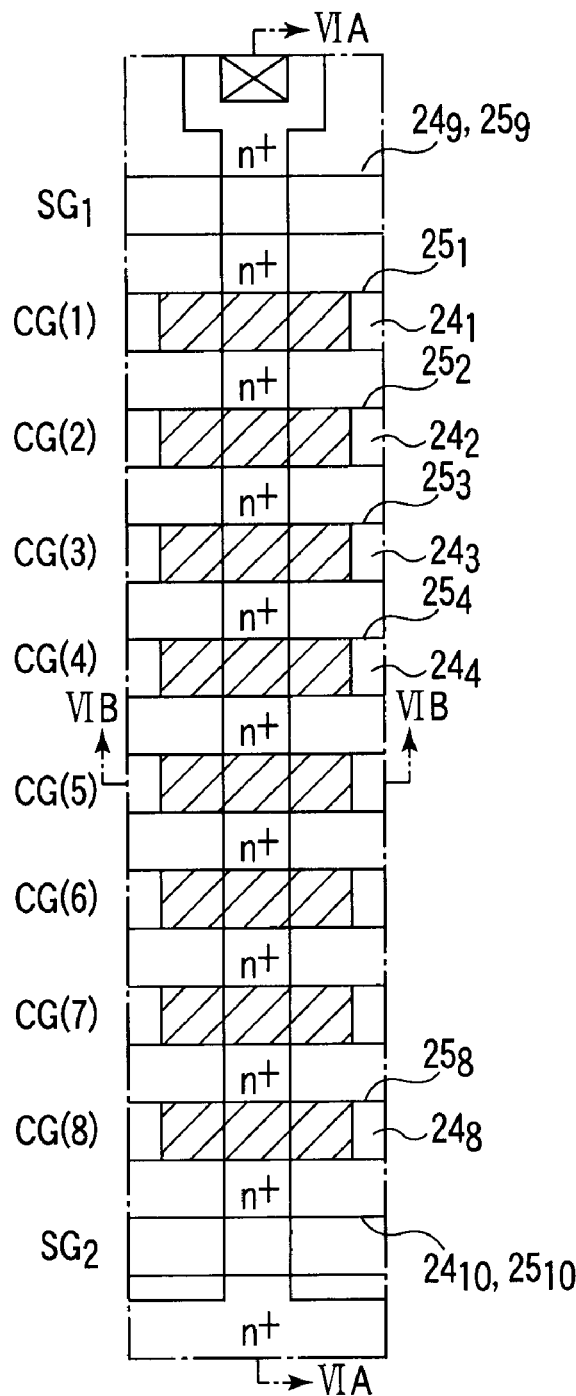
FIG. 5A is a plan view of a NAND cell portion in the memory cell array of FIG. 4.
Figure 5B:
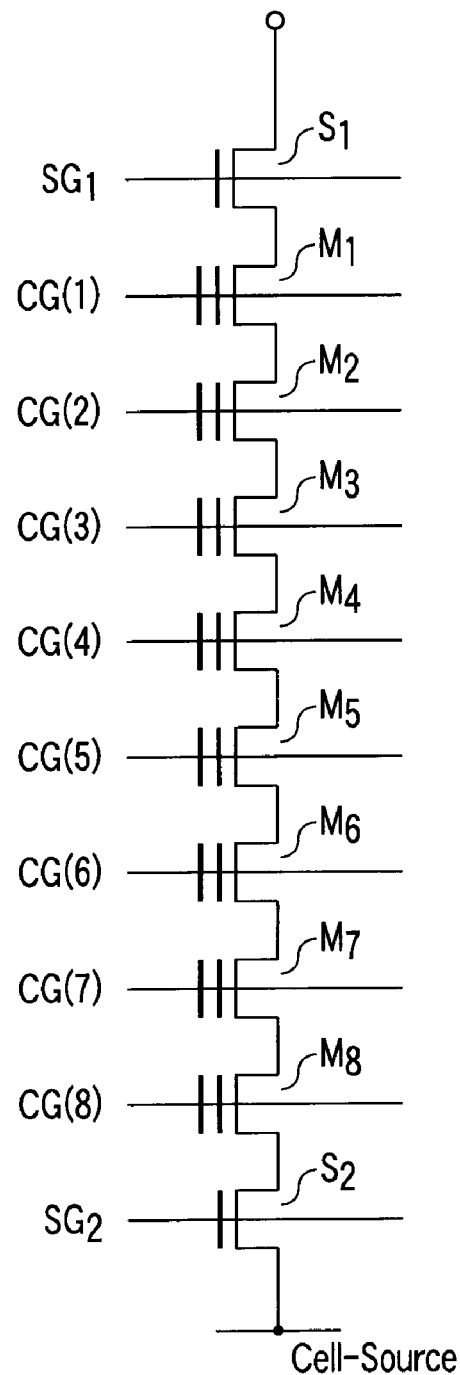
FIG. 5B shows an equivalent circuit of the NAND cell of FIG. 5A.
Figure 6A:
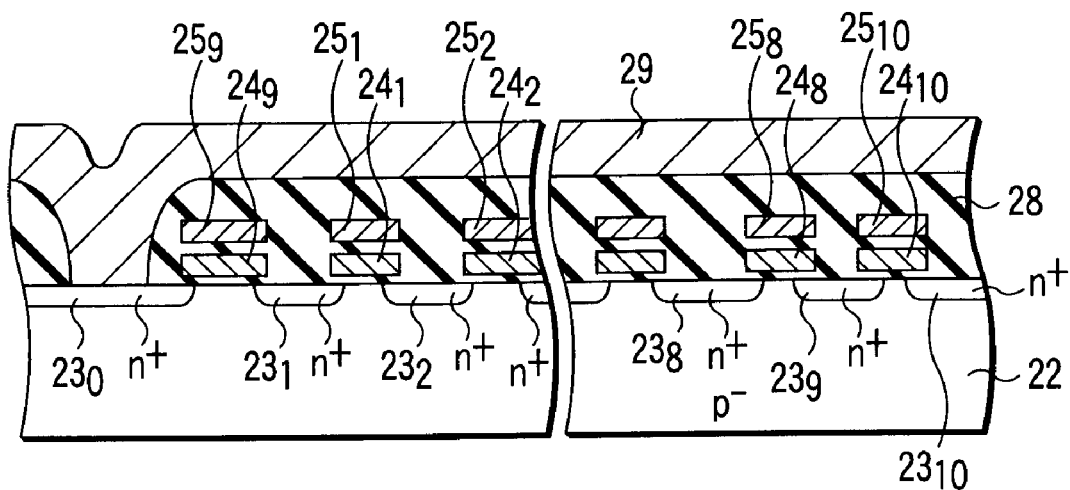
FIG. 6A is a sectional view taken along line XIA-XIA of FIG. 5A.
Figure 6B:
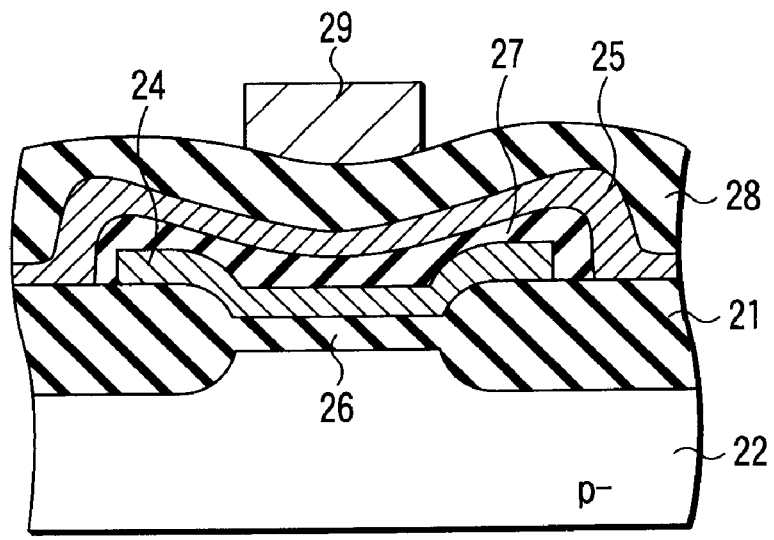
FIG. 6B is a sectional view taken along line XIB-XIB of FIG. 5A.

FIGS. 5A and 5B show a plan view of a NAND-cell portion in the memory cell array 1 of FIG. 4 and its equivalent circuit diagram, respectively. FIGS. 6A and 6B are sectional views taken along line XIA-XIA and line XIB-XIB, respectively, of FIG. 5A.

In the memory cell array, a large number of NAND cells (each of a plurality of memory cells) are formed in a p-type silicon substrate (or p-type well) 22 in such a way that they are isolated from one another by a device isolation oxide film 21. One NAND cell includes a plurality of memory cells (in this example, eight memory cells M1 to M8) which are connected in series so that adjacent ones share n-type diffused regions 23 ($23_0, 23_1, \ldots, 23_{10}$) serving as their source/drain regions. On the drain and source sides of the NAND cell, select gates $24_9, 25_9$ and $24_{10}$ and $25_{10}$ are placed which are formed simultaneously with the floating and control gates of the respective memory cell transistors.

Each memory cell has a stacked-gate MOSFET structure such that a floating gate 24 ($24_1, 24_2, \ldots, 24_8$) is formed over the semiconductor substrate 22 with a gate insulating film 26 interposed therebetween and a control gate 26 ($26_1, 26_2, \ldots, 26_8$) is formed over the floating gate 24 with a gate insulating film 27 interposed therebetween.

The substrate thus formed with the elements is covered with a CVD oxide layer 28, which is formed on top with bit lines 29. Each bit line is contact with the diffused region $23_0$ on the drain side of a corresponding NAND cell.

Such NAND cells as described above are arranged in a matrix form. The select gate transistor on the drain side of each NAND cell is connected to a corresponding bit line and the select gate transistor on the source side is connected to a common source line (cell-source voltage).

The control gates 25 of the respective memory cells M1 to M8 are respectively connected with select gate lines (word lines) CG1, CG2, . . . CG8 that extend in the row direction of the memory cell array.

The gates of the respective select gates $24_9, 25_9$ and $24_{10}, 25_{10}$ are also connected to select gate lines SG1 and SG2, respectively, which extend in the row direction of the memory cell array.

FIG. 7 shows a portion of the equivalent circuit of the memory cell array 1 in which such NAND cells as shown in FIGS. 5A and 5B are arrayed in a matrix form.

A group of NAND cells that share the same word lines and select gate lines is referred to as a block. For example, NAND cells within a region enclosed with dotted lines form one block. A read/program operation is performed on a selected one of the blocks.

Figure 8:
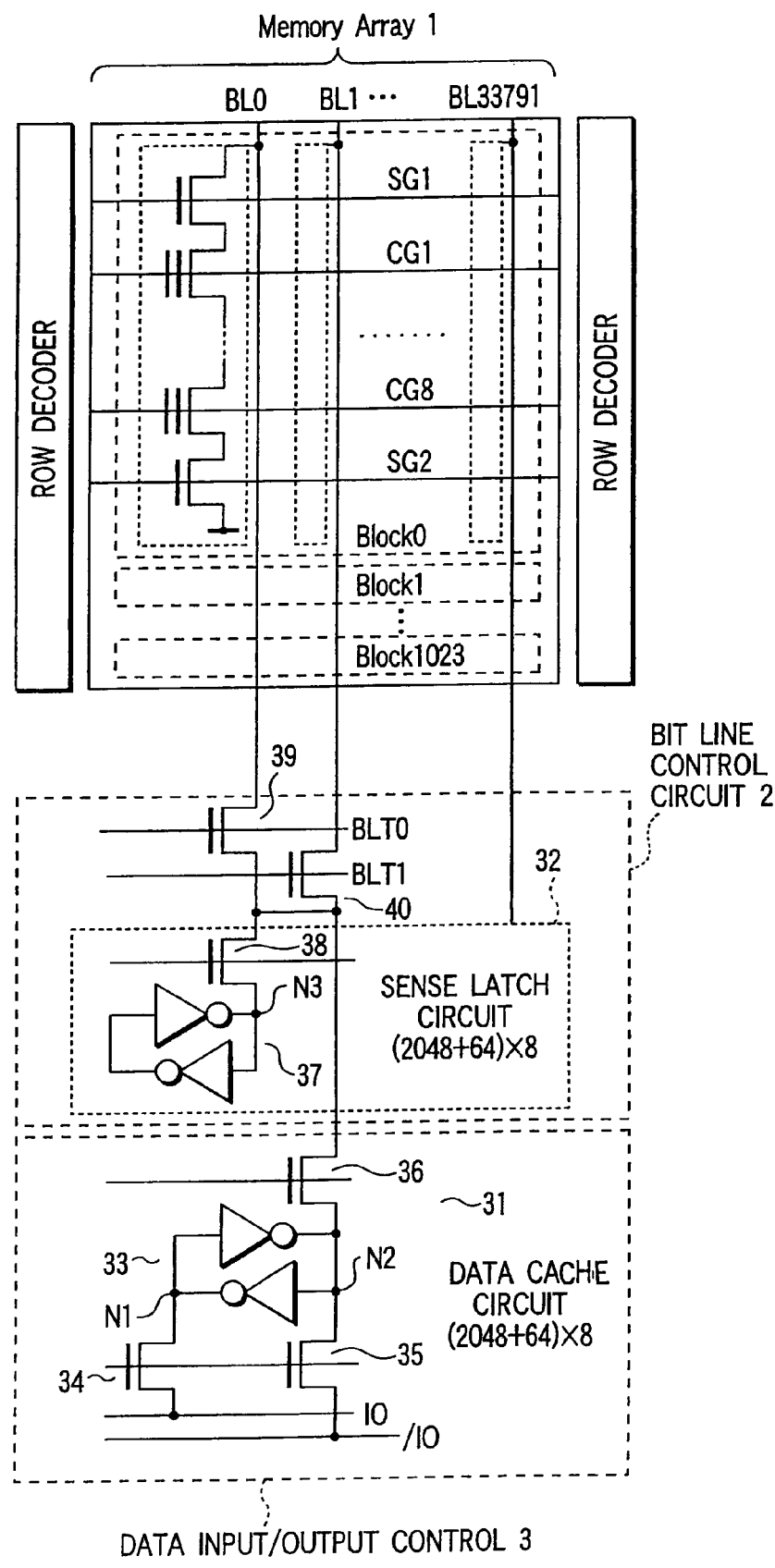
FIG. 8 shows example arrangements of the memory cell array, the bit line control circuit and the data input/output control circuit in FIG. 4.

FIG. 8 shows example circuit arrangements of the memory cell array 1, the bit line control circuit 2, and the data input/output control circuit 3.

As shown in FIG. 8, a pair of IO and /IO lines over which data is sent to or from the data input/output buffer 4 is coupled through data cache circuits 31 in the data input/output control circuit 3 to sense latch circuits 32 in the bit line control circuit 2. The data cache circuits 31 and the sense latch circuits 32 are each included of two inverters. More specifically, each data cache circuit 31 includes a latch circuit 33 which has two inverters, a switching transistor 34 connected between the IO line and one data storage node N1 of the latch circuit 33, a switching transistor 35 connected between the /IO line and the other data storage node N2 of that latch circuit 33, and a switching transistor 36 connected between the data storage node N2 and the corresponding sense latch circuit 32.

Each sense latch circuit 32 includes of a latch circuit 37 consisting of two inverters and a switching transistor 38 having its one end connected to a data storage node N3 of that latch circuit 37. The bit line control circuit 2 is provided with two switching transistors 39 and 40 for each sense latch circuit 32. The transistor 39 is connected between the other end of the transistor 38 and one of the even-numbered bit lines in the memory cell array 1, while the transistor 40 is connected between the other end of the transistor 38 and one of the odd-numbered bit lines in the memory cell array 1. The switching transistors 39 and 40 have their gates controlled by bit line select signals BLT0 and BLT1, respectively.

That is, only the data cache circuit 31 is directly connected to the paired IO and /IO lines. The sense latch circuit 32 is connected through the data cache circuit 31 to the IO and /IO lines.

The memory cell array 1 in FIG. 8 has 33,792 bit lines BL0 to BL33791 and 1,024 blocks Block0 to Block1023. Row decoders are placed on opposite sides in the row direction of the memory cell array.

In the circuit of FIG. 8, between two odd- and even-numbered bit lines and the paired IO and /IO lines are connected two types of latch circuits: one sense latch circuit 32 and one data cache circuit 31. Thus, in program or read operation, only one of the two bit lines connected to the sense latch circuit 32 is selected and only the memory cells connected to the selected bit line can be programmed into or read from.

It is only the sense latch circuit 32 that is used in data program operation; thus, the data cache circuit 31 can be used for an operation independent of the data program operation. For example, the data cache circuit 31 can be used to input the next program data, i.e., program data to the next page.

Figure 9:
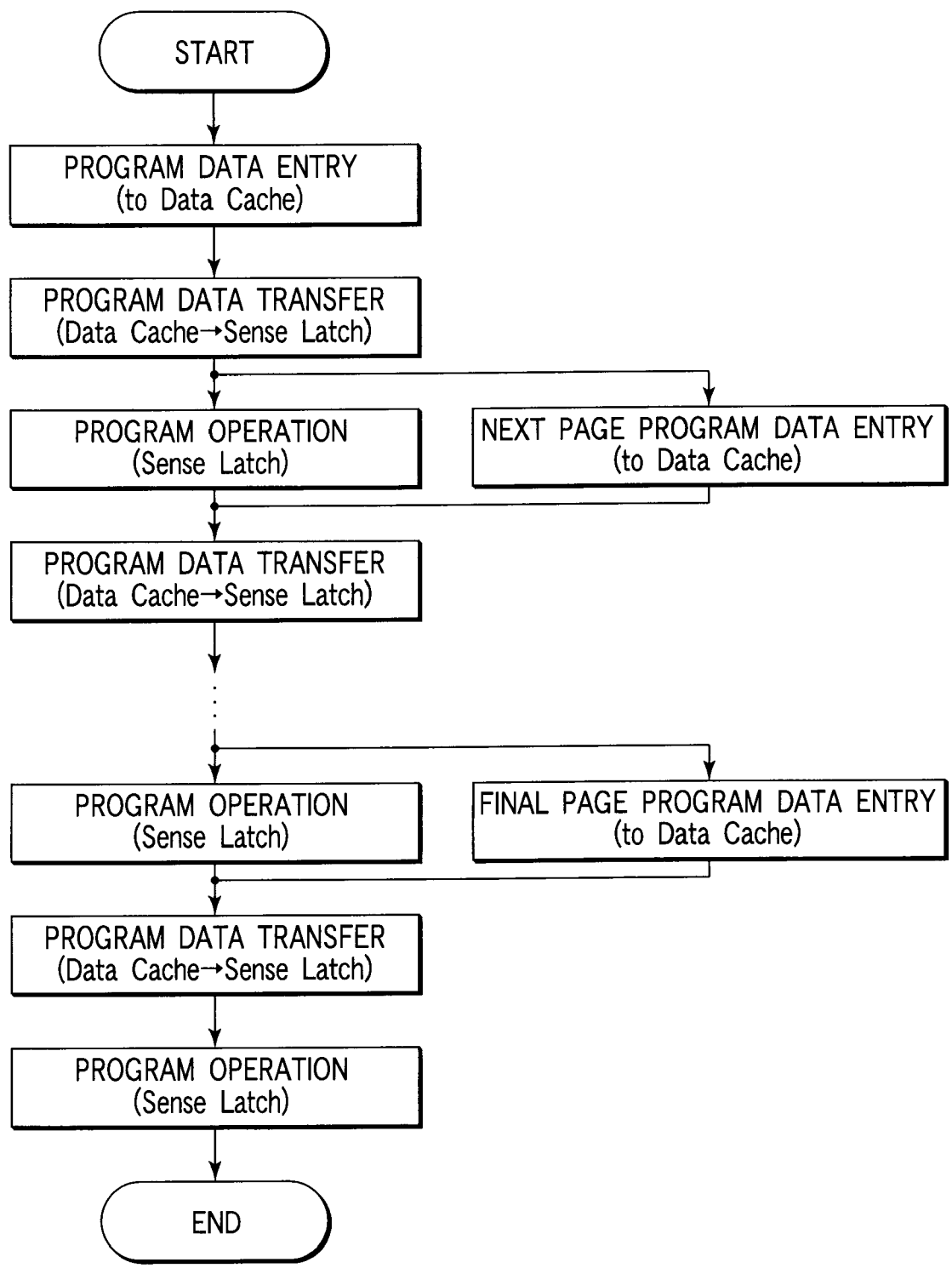
FIG. 9 is a flowchart illustrating an algorithm for a data program sequence in the memory of FIG. 8.
Figure 10:
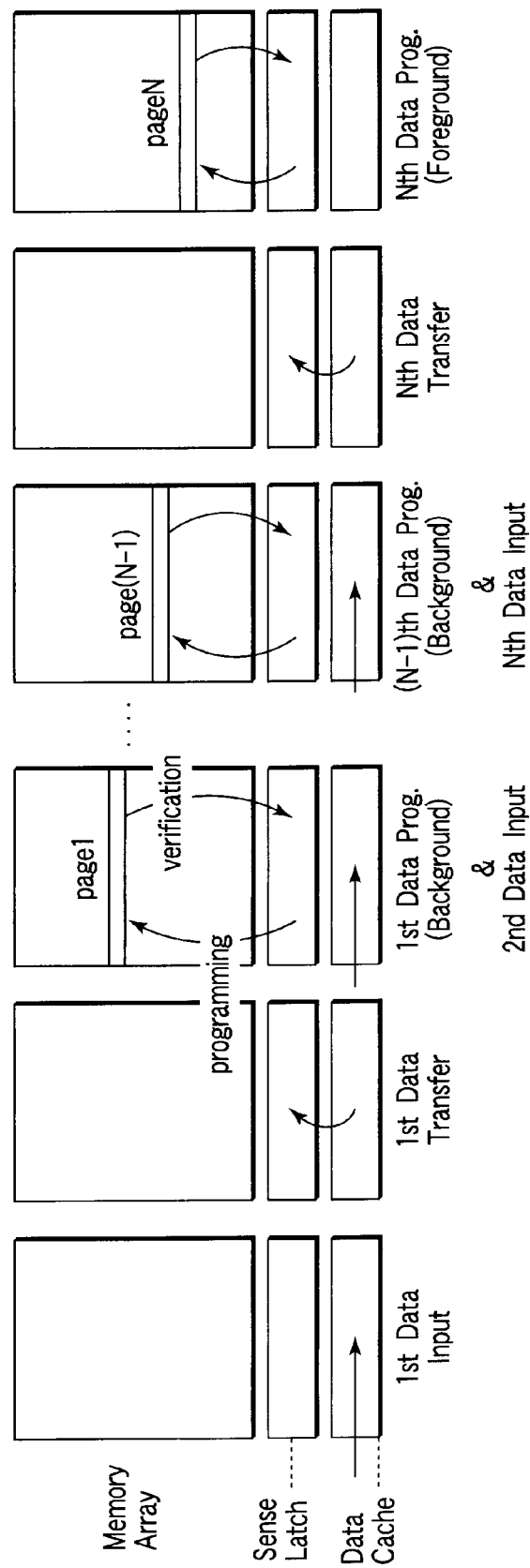
FIGS. 10A through 10F are diagrams for use in explanation of the operation of the memory of FIG. 8 when the algorithm of FIG. 9 is used.

FIG. 9 is a flowchart illustrating an algorithm for a data program sequence in the circuit of FIG. 8.

This algorithm indicates the manner in which the operation of programming data to one page and the operation of inputting data to be programmed to the next page are performed concurrently in the data program sequence in which data is programmed to each of the pages in sequence. In the first step, an operation of inputting program data to the data cache circuit 31 (to Data Cache) (PROGRAM DATA ENTRY) is performed. In the next step, an operation of transferring the program data from the data cache circuit 31 to the sense latch circuit 32 (Data Cache Sense Latch) is performed. In the subsequent step, an operation of programming data latched in the sense latch circuit 32 into a memory cell is performed (Use Sense Latch). Concurrently with this data program operation, an operation of inputting the next program data to the data cache circuit 31 is performed (to Data Cache).

As in the case of the previous data, the next program data is transferred from the data cache circuit 31 to the sense latch circuit 32 and then programmed into a memory cell.

The algorithm of FIG. 9 requires transfer of data from the data cache circuit 31 to the sense latch circuit 32. However, compared with the time required by a data program operation (usually of the order of 200 μs) or a data entry operation (usually of the order of tens of as to hundreds of μs), the time required by a data transfer is very short, usually of the order of 2 to 3 μs. Thus, the data transfer time has little influence on the overall time of the data program sequence.

Here, the advantages of the algorithm of FIG. 9 over the conventional algorithm of FIG. 2 will be described in terms of the data program time per page.

The data program time per page required by the algorithm of FIG. 9 is the sum of the time required by the longer one of the data program and entry operations which are performed concurrently and the data transfer time. In contrast to this, the data program time per page required by the algorithm of FIG. 2 is the sum of the data program time and the data entry time.

In view of the fact that usually the data program time is, at most, of the order of 200 μs and the data input time is of the order of 200 μs, the data program time and the data input time are of substantially the same order. Therefore, the use of the algorithm of FIG. 9 results in a data program time per page of the order of 200 μs.

In contrast, in the case of the algorithm of FIG. 2, the data program time per page becomes 200 μs plus 200 μs. Therefore, the use of the algorithm of FIG. 9 allows the overall time of the data program sequence to be made much shorter than does the algorithm of FIG. 2.

FIGS. 10A through 10F schematically illustrate the operation of the circuit of FIG. 8 when the algorithm of FIG. 9 is used.

In FIGS. 10A through 10F, a data program operation which is concurrent with a data input operation is labeled "Background" and an independent data program operation is labeled "Foreground". The data program operation is labeled "Data Prog.". The data program operation is performed by repeating an operation of applying the data programming voltage to a memory cell (programming) and a program verification operation (verification).

In the data program operation to the final page, there is no need to input data to be programmed to the next page; thus, an independent program operation is performed as shown in FIGS. 9 and 10A through 10F. No background operation is therefore required in the data program operation to the final page. That is, since there is no need to perform an operation concurrently with another operation, and use of a foreground operation, the overall time of the data programming sequence is not change.

Figure 11:
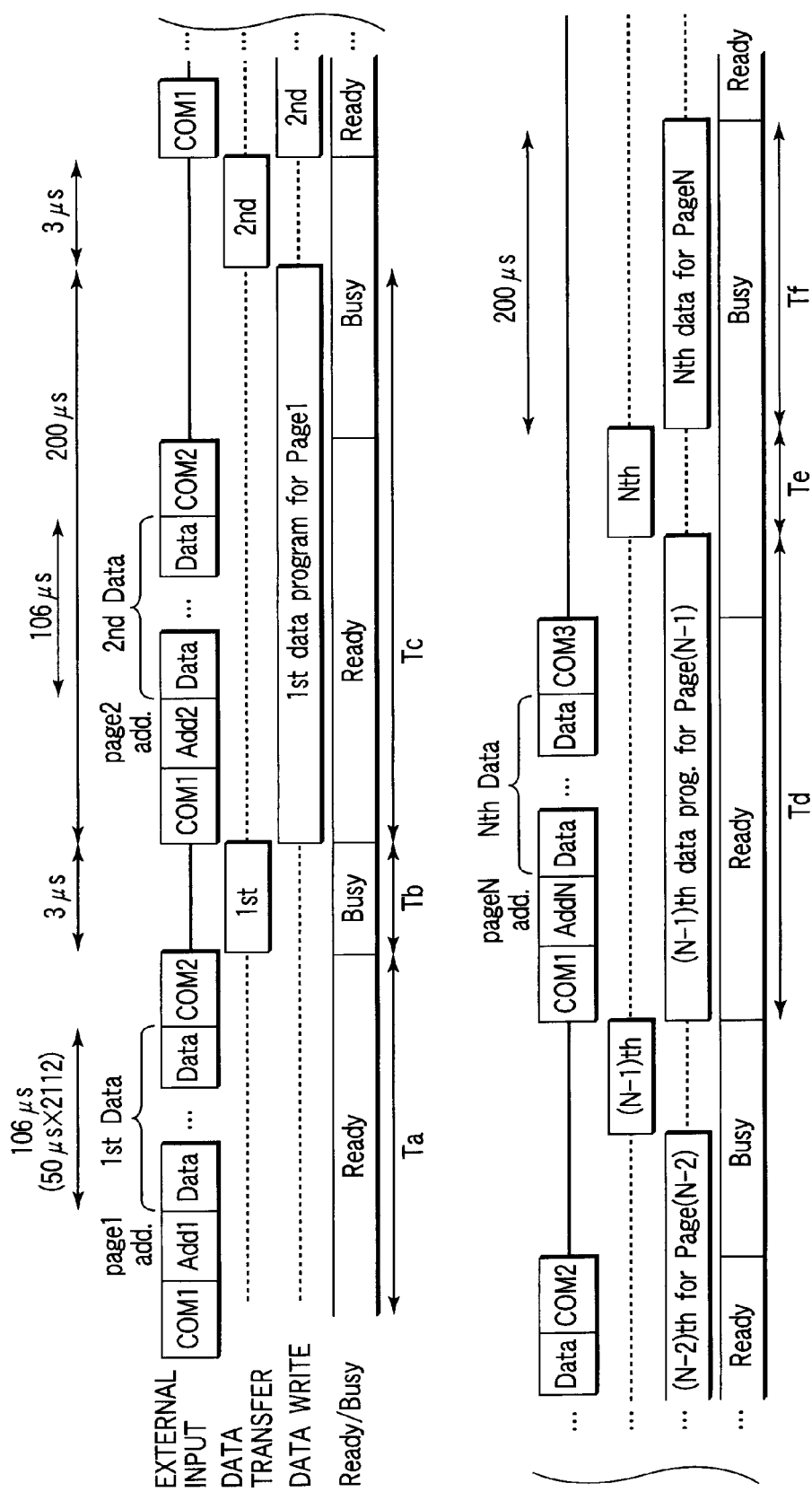
FIG. 11 shows the flow of control in the data program sequence in a semiconductor chip formed with the NAND cell EEPROM of FIG. 4.

FIG. 11 shows an example of a data program sequence control method for a semiconductor chip formed with the NAND cell EEPROM of FIG. 4. The operations in intervals Ta through Tf in FIG. 11 correspond to those in FIGS. 10A through 10F.

A general control method for implementing a program operation involves a sequence of entry of an address/data inputting command (COM1), entry of an address to which data is to be programmed, entry of program data, entry of a command to initiate the data program operation, and initiation of the data program operation. There are two commands to initiate the data program operation: a command (COM2) for a background program operation which can be performed concurrently with a program data input operation, and a command (COM3) for a foreground program operation that cannot be performed concurrently with another operation.

When the command COM3 is input, the busy interval in the ready/busy state indicating the chip operating state becomes long and the busy state lasts until the COM3-based program operation is completed. The ready/busy state is detected by the R/B control circuit 17 through the operation of the data input/output control circuit 3 in FIG. 4, whereby a plurality of ready/busy signals is produced.

When the command COM2 is input, on the other hand, the busy interval in the ready/busy state becomes short. A return is made from the busy state to the ready state immediately after program data input immediately prior to entry of the command COM2 has been transferred from the data cache circuit 31 to the sense latch circuit 32.

Usually use is made of the command COM2 for pages other than the final page in the data program sequence, thereby allowing a data program operation and a data input operation to be performed concurrently to reduce the time required. The command COM3 is used for the final page to facilitate the detection of completion of the data program sequence. That is, the use of a method that enables the completion of the sequence to be detected through examination of the ready/busy state is particularly effective.

FIG. 11 shows the case where data is programmed into each page in the order of page 1, page 2, ..., page N and the times indicated by numerical values correspond to the case where the amount of input data is assumed to be 2,112 bytes per page, the data input cycle to be 50 ns, the time required to transfer data from the data cache circuit 31 to the sense latch circuit 32 to be 3 µs, and the time required to program data to be 200 µs.

In the method shown in FIG. 11, the quasi-ready state is output during the background program operation as in the Tc and Td intervals. During the quasi-ready state, the entry of commands other than commands such as COM1, COM2 and COM3, which are associated with data program operations, is inhibited. Such commands are associated with, for example, data read and erase operations. Usually, the entry of these inhibit commands will be described in chip specifications.

It is effective to design a chip in such a way as to, when an inhibit command is entered, ignore the command and continue the background operation. Such a chip will prevent malfunctions.

Specifically, valid commands include programming-related commands, such as COM1, COM2 and COM3, a reset command, and commands to output signals indicating the Ready/Busy state and the PASS/FAIL status. Commands to be inhibited or ignored are commands other than the above valid commands and include reading-related commands and erasing-related commands.

Like a chip ID output command, some of commands may be classified under either of valid and inhibit commands. In order to make circuit arrangements straightforward, they should preferably be taken into the inhibit commands.

Although the first embodiment has been described in terms of the circuit arrangement of FIG. 8, this is merely an example.

FIG. 12 shows a first modification of the first embodiment.

As shown in FIG. 12, the memory cell array 1 is divided in the word line direction into two memory cell arrays 1-1 and 1-2 and one block is halved between the two memory cell arrays. The present invention is also effective in such a configuration.

In the configuration of FIG. 12, memory cells corresponding to one page may be placed halved between the two memory cell arrays 1-1 and 1-2. The present invention is also effective in performing such operations as described above on the memory cells for one page placed in the right and left memory cell arrays.

In the configuration of FIG. 12, memory cells for one page may be placed in only one of the memory cell arrays 1-1 and 1-2. The present invention is also effective in performing such operations as described above on memory cells for two different pages which are placed in the right and left memory cell arrays which are selected simultaneously.

Figure 13:
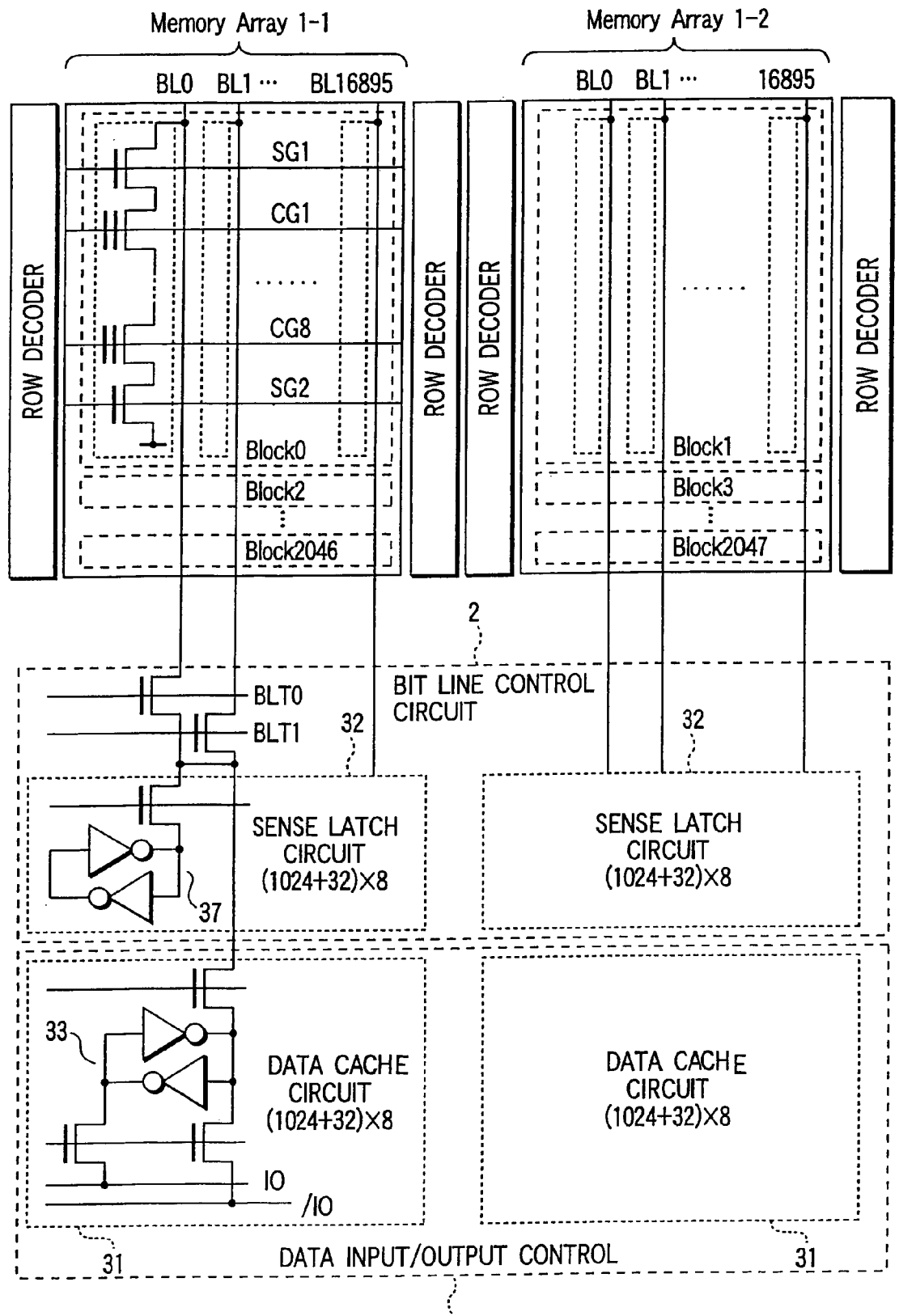
FIG. 13 shows a second modification of the memory cell array of the first embodiment.

FIG. 13 shows a second modification of the first embodiment.

As shown in FIG. 13, the memory cell array 1 is divided in the word line direction into two memory cell arrays 1-1 and 1-2 and one block is placed only in one of the two memory cell arrays. The present invention is also effective in such a configuration.

The present invention is also effective in performing the aforementioned operations on memory cells for two different pages which are placed in the right and left memory cell arrays in the configuration of FIG. 13. In this case, memory cells for two pages in different blocks can be programmed into at the same time.

In addition, the memory cell array may be divided into three or more. In this case as well, the present invention is effective and such operations as described above can be implemented.

A comparison is next made between a control method of the present invention and a conventional control method for data programming.

Figure 14A:
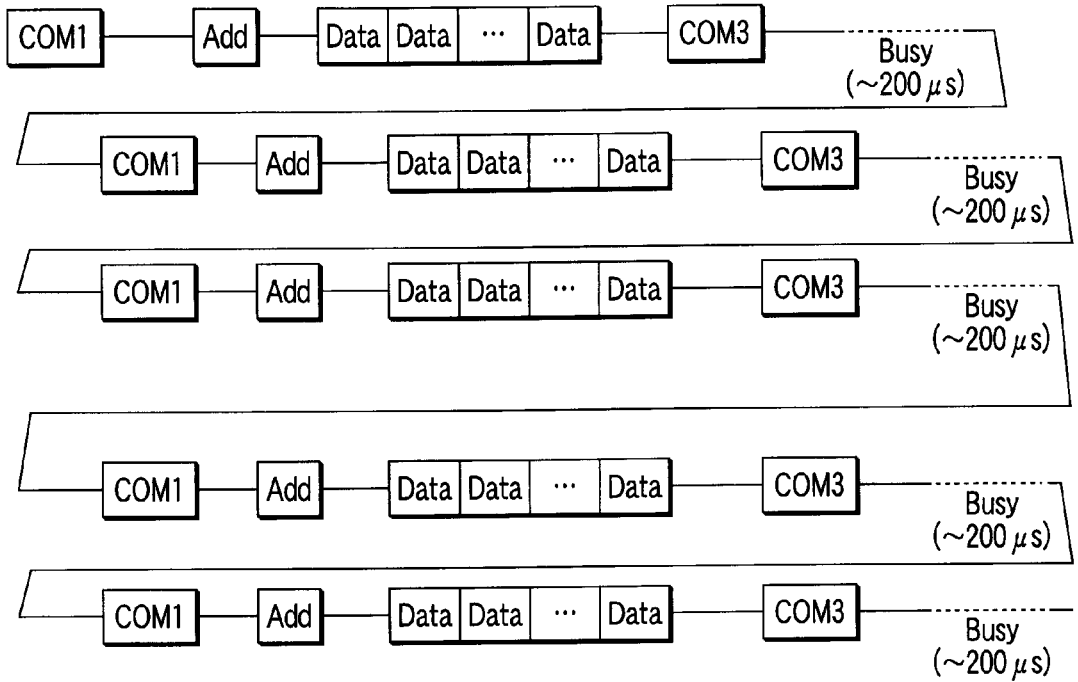
FIGS. 14A, 14B and 14C show conventional and inventive data program sequences.
Figure 14B:
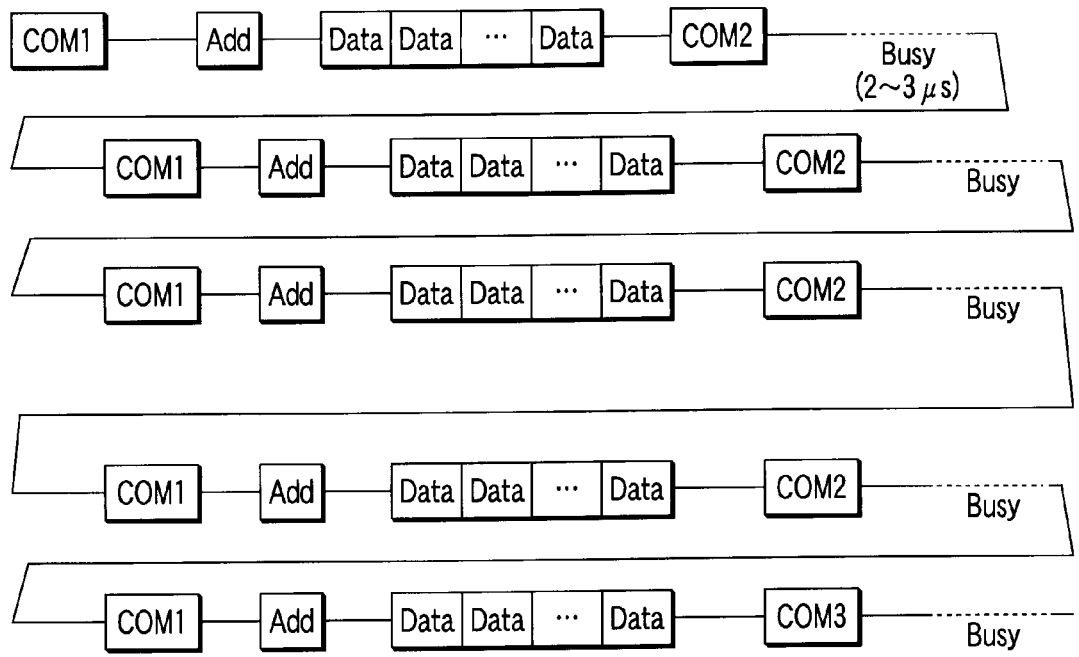

FIG. 14A is a schematic representation of the conventional data programming control method and FIG. 14B is a schematic representation of the control method for the data program sequence shown in FIG. 11.

In the conventional method shown in FIG. 14A, the data program operations for all pages are performed by foreground processing. In the method shown in FIG. 14B, on the other hand, on pages other than the final page the program operations are performed by background processing.

Figure 14C:
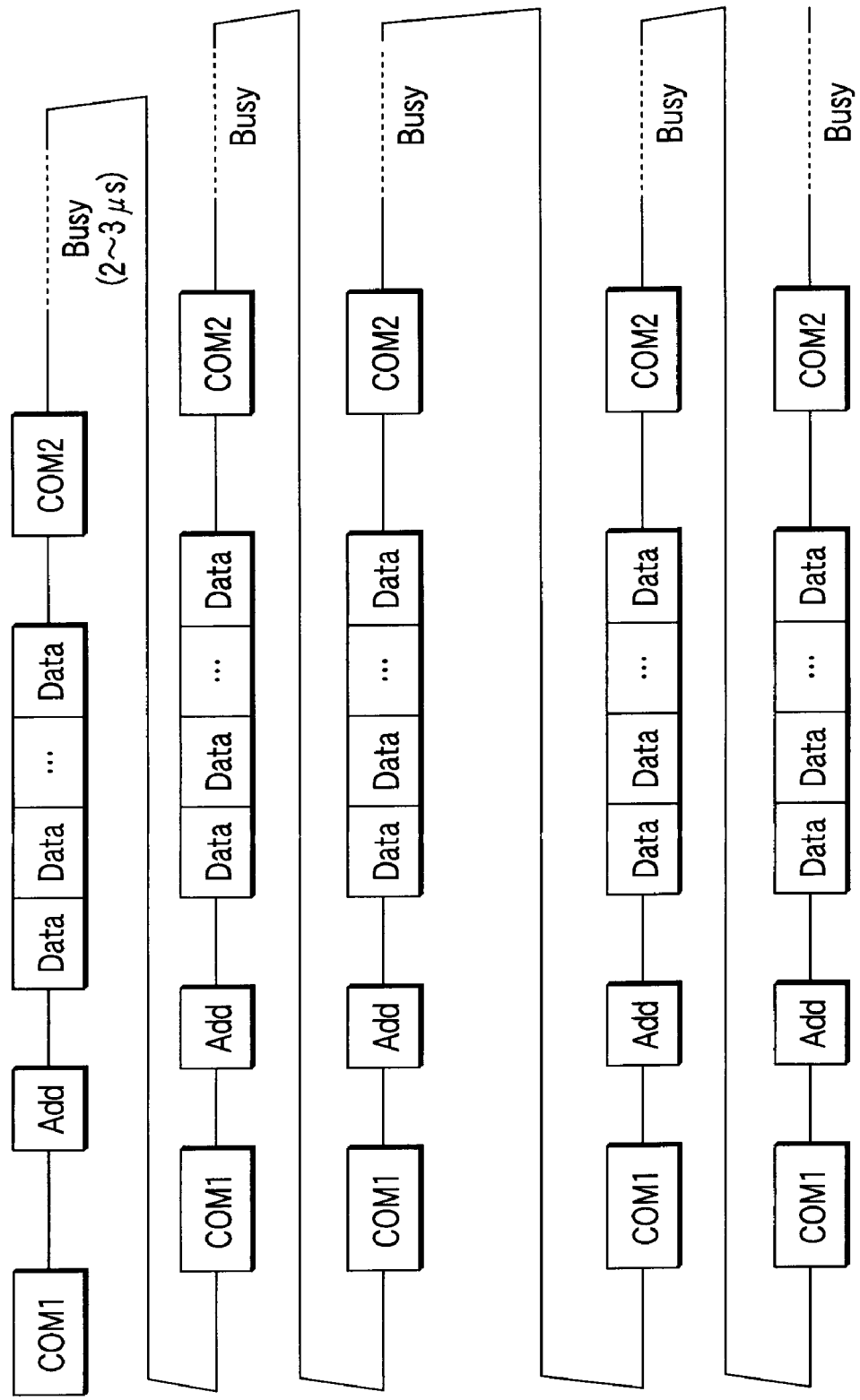

FIG. 14C shows another control method of the present invention.

According to this method, the data program operations are performed on all pages by background processing. In this case as well, the first embodiment is effective.

FIGS. 15A through 15F illustrate the manner in which busy signals are output in data program operations when the control method of FIGS. 14A through 14C are used. In these figures, address/data inputs are omitted in portions in which command inputs are described only for the purpose of simplifying illustration.

The signal "Cache-R/B" in FIGS. 15A through 15F indicates the read/busy states, for example, the ready/busy states in FIG. 11 and usually corresponds to the chip ready/busy states output from the I/O pads I/O-1 to I/O-8 in FIG. 4. A pad may be provided to indicate the chip ready/busy state. In this case, the pad indicates a ready/busy state that usually corresponds to Cache-R/B. The signal "True-R/B" represents the in-chip operating states including background operations and always assumes the busy state during a background operation.

Figure 15A:
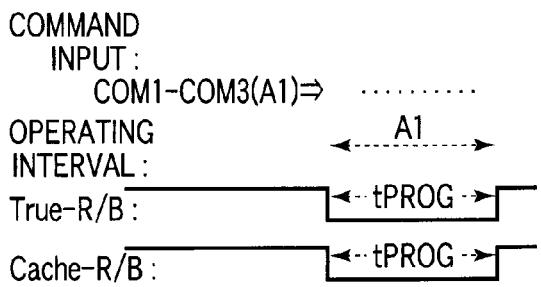

FIG. 15A shows a case where conventional data program operations are performed independently, which correspond to foreground operations. In this case, the two signals Cache-R/B and True/R/B are coincident in state with each other in the data program operation interval tPROG.

Figure 15B:
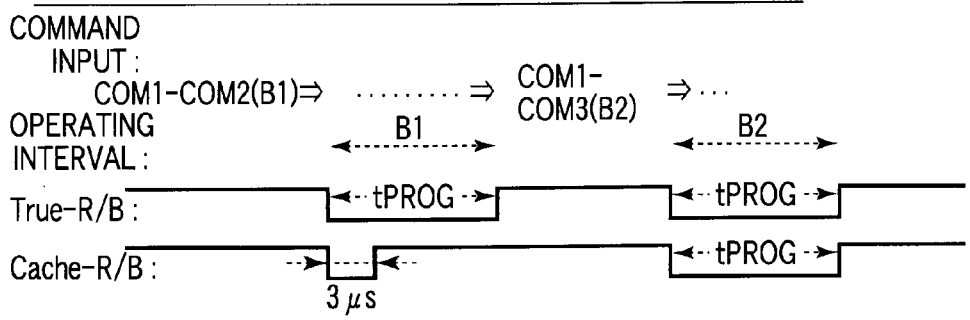
Figure 15C:
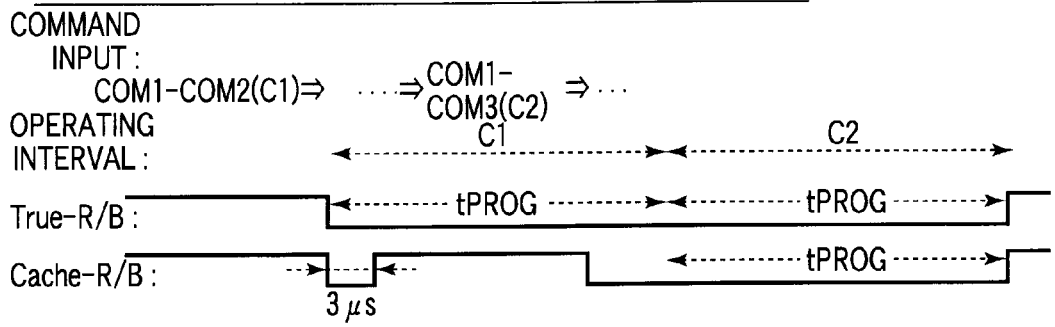
Figure 15D:
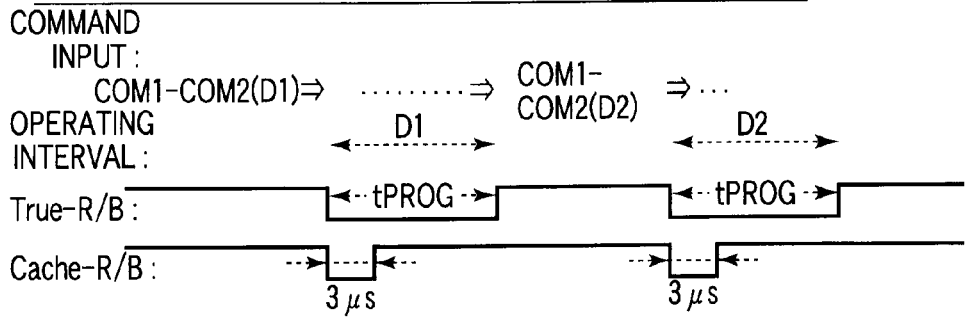
Figure 16A:
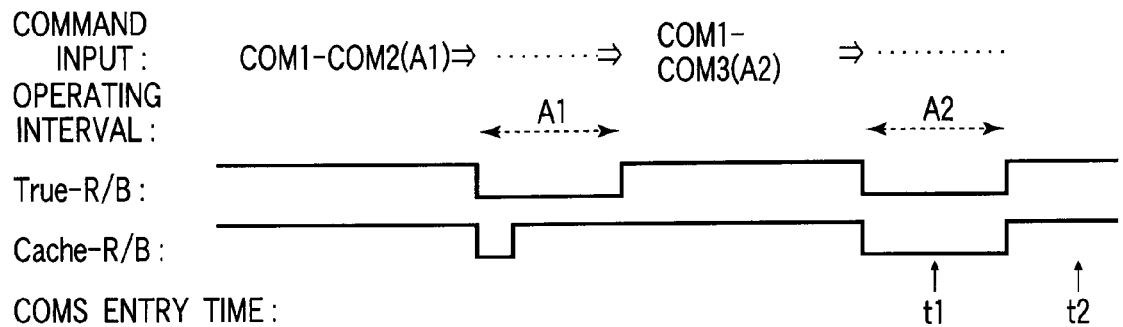
Figure 16B:
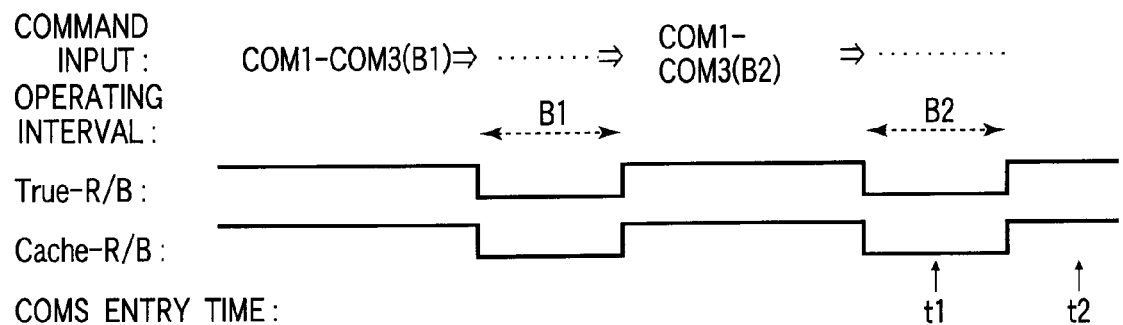
Figure 16C:
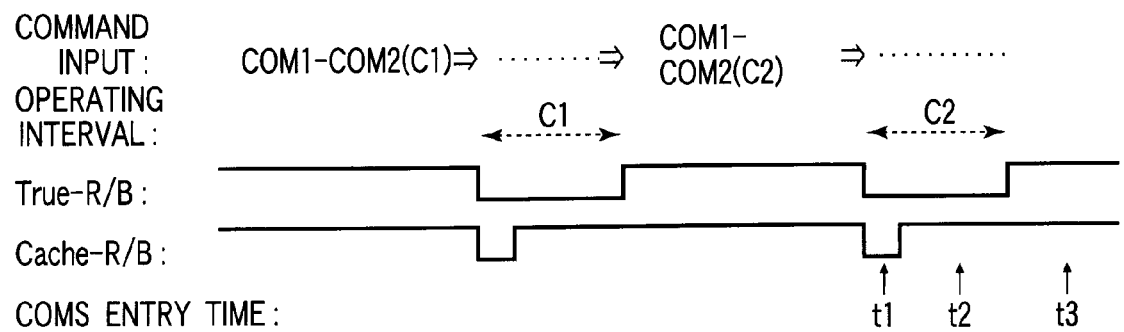
Figure 16G:
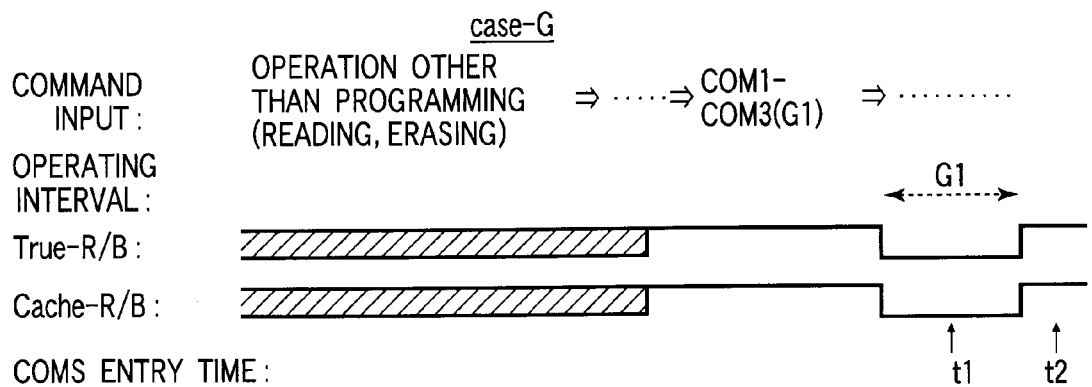
Figure 16H:
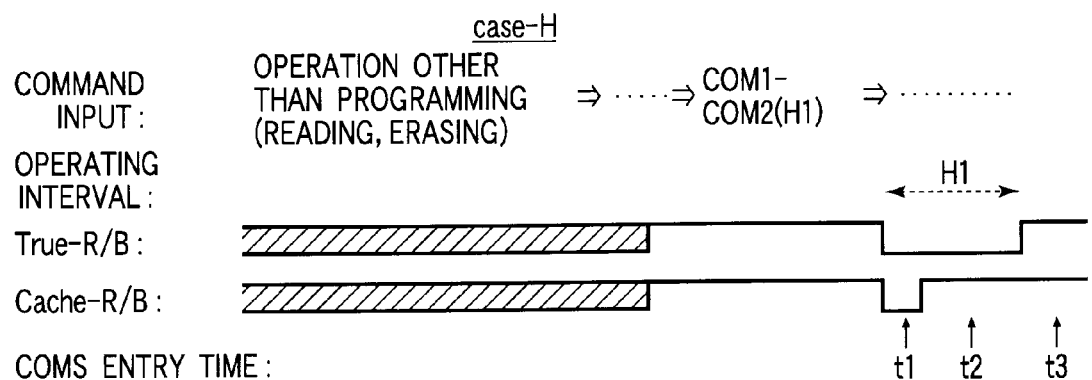
Figure 16I:
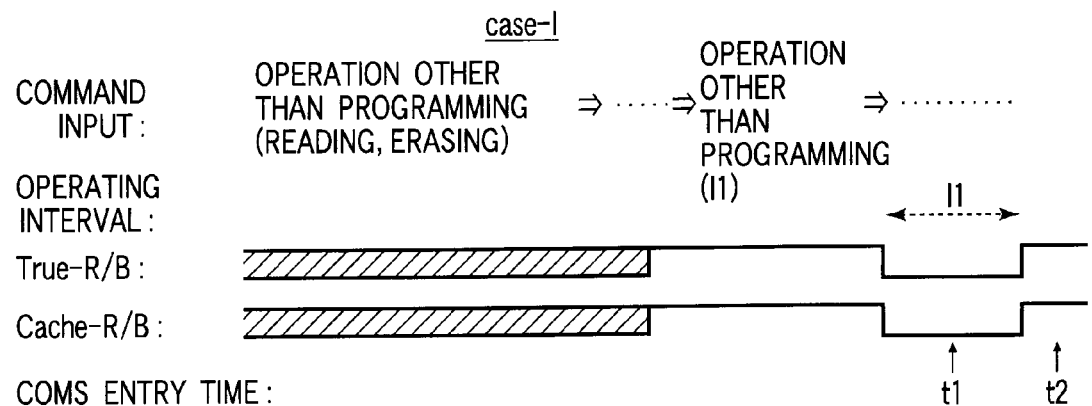
Figure 16J:
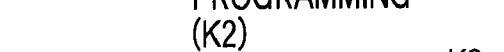
Figure 16K:
Figure 17A:
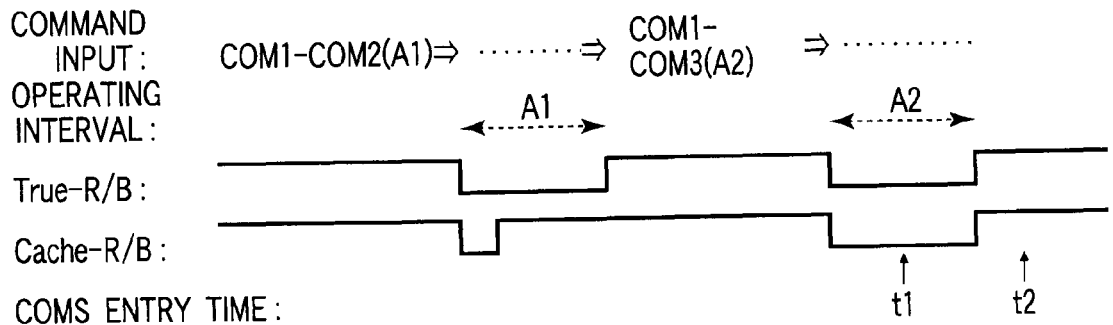
FIGS. 17A through 17F are timing diagrams of operations when the cumulative PASS/FAIL status is output for two program operations at status read time in the first embodiment.
Figure 17B:
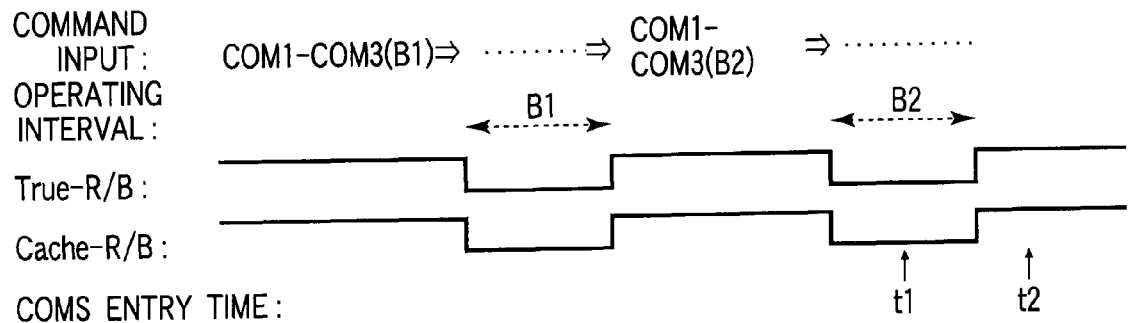
Figure 17C:
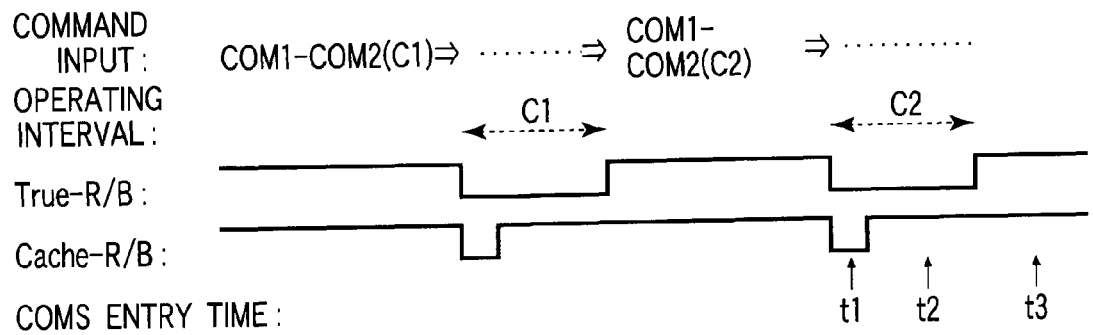
Figure 17D:
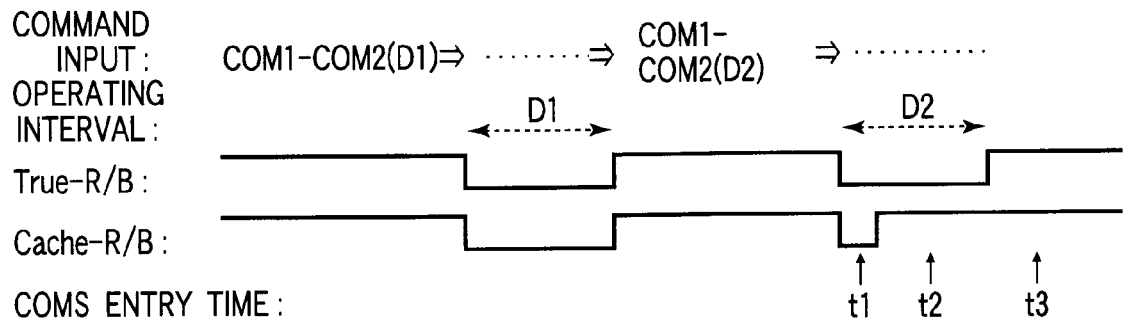
Figure 17E:
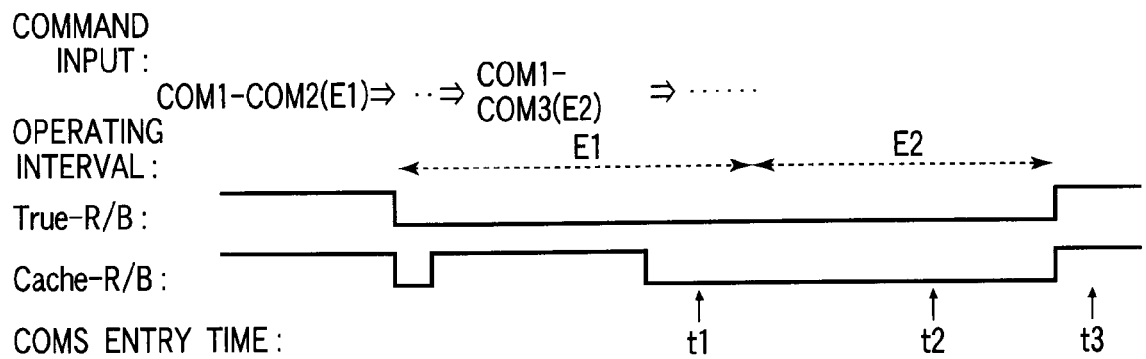
Figure 17F:
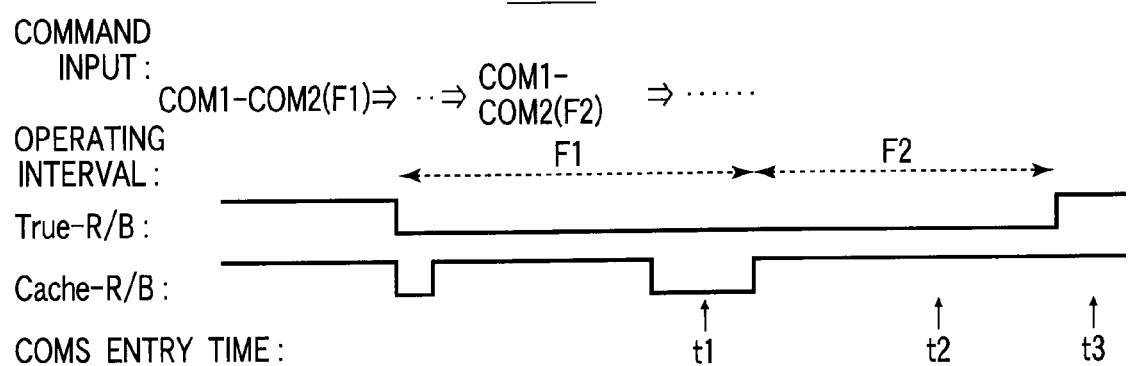

FIGS. 15B and 15D illustrate program operation intervals tPROG and busy signal states when two data program operations are performed successively and a second-operation start command is input after the termination of the first operation.

FIGS. 15C and 15E illustrate program operation intervals tPROG and busy signal states when two data program operations are performed successively and a second-operation start command is input during the first program operation.

FIG. 15F illustrates a program operation interval tPROG and busy signal states when a data program operation start command is input after the termination of a busy signal being output through an operation other than a program operation.

From FIGS. 15A through 15F it can be seen that, when the background operations are involved, the ready/busy state varies variously with the input timing of the operation start command.

To examine the PASS/FAIL status after the termination of a certain operation, a chip status output command COMS is simply input to the I/O pads I/O-1 to I/O-8. The chip status output command is sent through the data input/output buffer 4 to the command decoder 13 in FIG. 4, which in turn produces control signals used to output the PASS/FAIL status.

As described previously, after the termination of a data program operation, the PASS/FAIL status is holding by the PASS/FAIL holding circuit 15. To examine the PASS/FAIL status, a chip status output command COMS is input to the I/O pads I/O-1 to I/O-8. The PASS/FAIL status held by the PASS/FAIL holding circuit 15 is then output from the I/O pads I/O-1 to I/O-8 via the data input/output buffer 4.

In general, the operation of outputting the chip status containing the PASS/FAIL status after entry of the chip status command COMS is called "status read".

FIGS. 16A through 16F illustrate the time dependence of the PASS/FAIL output results at the status read time when program operations are performed in succession.

FIGS. 16G through 16K illustrate the time dependence of the PASS/FAIL output results at the status read time when an operation other than a program operation and a program operation are performed in succession.

Tables 1A through 1K below indicate the status outputs at times (t1, t2, t3) indicated in FIGS. 16A through 16K.

In Tables 1A through 1K, the expression "A1-status" represents the PASS/FAIL status for an operation during the A1 interval (A1 operation). Likewise, the expressions "A2-status", "B1-status", "B2-status", etc. represent the PASS/FAIL status for the corresponding operations (A2 operation, B1 operation, B2 operation, etc.) in FIGS. 16A through 16K.

TABLE 1A

| COMS Input Time | Status Output | |
|---|---|---|
| | I/O-1 | I/O-2 |
| t1 | invalid | invalid |
| t2 | A2-status | A1-status |

TABLE 1B

| COMS Input Time | Status Output | |
|---|---|---|
| | I/O-1 | I/O-2 |
| t1 | invalid | invalid |
| t2 | B2-status | B1-status |

TABLE 1C

| COMS Input Time | Status Output | |
|---|---|---|
| | I/O-1 | I/O-2 |
| t1 | invalid | invalid |
| t2 | invalid | C1-status |
| t3 | C2-status | C1-status |

TABLE 1D

| COMS Input Time | Status Output | |
|---|---|---|
| | I/O-1 | I/O-2 |
| t1 | invalid | invalid |
| t2 | invalid | D1-status |
| t3 | D2-status | D1-status |

TABLE 1E

| COMS Input Time | Status Output | |
|---|---|---|
| | I/O-1 | I/O-2 |
| t1 | invalid | invalid |
| t2 | invalid | invalid |
| t3 | E2-status | E1-status |

TABLE 1F

| COMS Input Time | Status Output | |
|---|---|---|
| | I/O-1 | I/O-2 |
| t1 | invalid | invalid |
| t2 | invalid | F1-status |
| t3 | F2-status | F1-status |

TABLE 1G

| COMS Input Time | Status Output | |
|---|---|---|
| | I/O-1 | I/O-2 |
| t1 | invalid | Low ("0") |
| t2 | G1-status | Low ("0") |

TABLE 1H

| COMS Input Time | Status Output | |
|---|---|---|
| | I/O-1 | I/O-2 |
| t1 | invalid | Low ("0") |
| t2 | invalid | Low ("0") |
| t3 | H1-status | Low ("0") |

TABLE 1I

| COMS Input Time | Status Output | |
|---|---|---|
| | I/O-1 | I/O-2 |
| t1 | invalid | Low ("0") |
| t2 | I1-status | Low ("0") |

TABLE 1J

| COMS Input Time | Status Output | |
|---|---|---|
| | I/O-1 | I/O-2 |
| t1 | invalid | Low ("0") |
| t2 | J2-status | Low ("0") |

TABLE 1K

| COMS Input Time | Status Output | |
|---|---|---|
| | I/O-1 | I/O-2 |
| t1 | invalid | Low ("0") |
| t2 | K2-status | Low ("0") |

As shown in FIGS. 16A through 16F, in view of the PASS/FAIL outputs when background operations are involved, it is very important to make clear which program operation a PASS/FAIL output by the status read corresponds to, i.e., which page the corresponding program operation corresponds to. If this is possible, in the event of programming failures, pages containing faulty data can be identified.

To make clear the correspondence between PASS/FAIL outputs and pages, in the case of successive program operations, PASS/FAIL outputs for two past program operations are obtained simultaneously or sequentially as indicated in tables 1A through 1I. That is, after entry of the chip status command COMS, signals representing the PASS/FAIL status are output from the two I/O pads I/O-1 and I/O-2 as shown. The expression "invalid" in each table represents data that does not reflect the PASS/FAIL status. This data need not be monitored.

Table 2 below indicates example data contents output from the eight I/O pads I/O-1 to I/O-8 at state read time in the first embodiment.

TABLE 2

| | Status | Output |
|---|---|---|
| I/O-1 | Chip Status-I | Pass → 0 Fail → 1 |
| I/O-2 | Chip Status-II | Pass → 0 Fail → 1 |
| I/O-3 | — | — |
| I/O-4 | — | — |
| I/O-5 | — | — |
| I/O-6 | — | — |
| I/O-7 | — | — |
| I/O-8 | — | — |

The I/O pad I/O-1 outputs the chip status (Chip Status-I) for an immediately preceding operation. The I/O pad I/O-2 outputs the chip status (Chip Status-II) corresponding to a program operation immediately prior to the immediately preceding operation. The chip status is "0" in the case of PASS and "1" in the case of FAIL.

When the system of FIGS. 16A through 16F is used, the PASS/FAIL status contents vary with the times of Cache-R/B, True-R/B and status read. It is therefore desired that Cache-R/B and True-R/B be contained in the status read output data. In this case, such outputs as indicated in Table 3 below will result.

TABLE 3

| | Status | Output |
|---|---|---|
| I/O-1 | Chip Status-I | Pass → 0 Fail → 1 |
| I/O-2 | Chip Status-II | Pass → 0 Fail → 1 |
| I/O-3 | — | — |
| I/O-4 | — | — |
| I/O-5 | — | — |
| I/O-6 | True-R/B | Busy → 0 Ready → 1 |
| I/O-7 | Cache-R/B | Busy → 0 Ready → 1 |
| I/O-8 | — | — |

In the above status read, the PASS/FAIL status and the ready/busy status are output after the entry of a command COMS.

FIGS. 17A through 17F show PASS/FAIL status outputs as a result of the PASS/FAIL status of two successive program operations being accumulated at the status read time in the first embodiment.

Tables 4A through 4F below indicate the status outputs at times (t1, t2, t3) indicated in FIGS. 17A through 17F.

TABLE 4A

| | Status Output | | |
|---|---|---|---|
| COMS Input Time | I/O-1 | I/O-2 | I/O-3 |
| t1 | invalid | invalid | A1-status |
| t2 | A2-status | A1-status | (A1 + A2)-status |

TABLE 4B

| COMS Input Time | Status Output | | |
|---|---|---|---|
| | I/O-1 | I/O-2 | I/O-3 |
| t1 | invalid | invalid | B1-status |
| t2 | B2-status | B1-status | (B1 + B2)-status |

TABLE 4C

| COMS Input Time | Status Output | | |
|---|---|---|---|
| | I/O-1 | I/O-2 | I/O-3 |
| t1 | invalid | invalid | C1-status |
| t2 | invalid | C1-status | C1-status |
| t3 | C2-status | C1-status | (C1 + C2)-status |

TABLE 4D

| | Status Output | | |
|---|---|---|---|
| COMS Input Time | I/O-1 | I/O-2 | I/O-3 |
| t1 | invalid | invalid | D1-status |
| t2 | invalid | D1-status | D1-status |
| t3 | D2-status | D1-status | (D1 + D2)-status |

TABLE 4E

| | Status Output | | |
|---|---|---|---|
| COMS Input Time | I/O-1 | I/O-2 | I/O-3 |
| t1 | invalid | invalid | invalid |
| t2 | invalid | invalid | E1-status |
| t3 | E2-status | E1-status | (E1 + E2)-status |

TABLE 4F

| | Status Output | | |
|---|---|---|---|
| COMS Input Time | I/O-1 | I/O-2 | I/O-3 |
| t1 | invalid | invalid | invalid |
| t2 | invalid | F1-status | F1-status |
| t3 | F2-status | F1-status | (F1 + F2)-status |

The expression "(A1+A2)-status" in Table 4A indicates the result of accumulation of the PASS/FAIL status of the A1 and A2 operations, namely, that, in the event of a failure in either of the A1 or A2 operation, the fail status is maintained.

In actual operation, data is frequently programmed over a continuous range of several pages to tens of pages. In such a case, the cumulative PASS/FAIL status for program operations corresponding to several pages to tens of pages is output.

With the cumulative status, there are two systems: one that enables that status to be reset by the usual RESET command and one that enables the status to be reset only by a dedicated RESET command.

Cumulative status systems include one that accumulates the PASS/FAIL status of operations from an operation immediately after the status has been reset to the last operation and one that accumulates the PASS/FAIL status only for particular operations or commands, for example, program operations or programming-related commands.

Table 5 below indicates example status read time data outputs containing the cumulative status as described above. In this case, the I/O pad I/O-3 outputs the cumulative status (cumulative chip status).

TABLE 5

|  | Status | Output |
|---|---|---|
| I/O-1 | Chip Status-I | Pass → 0 Fail → 1 |
| I/O-2 | Chip Status-II | Pass → 0 Fail → 1 |
| I/O-3 | Accumulated Chip Status | Pass → 0 Fail → 1 |
| I/O-4 | — | — |
| I/O-5 | — | — |
| I/O-6 | True-R/B | Busy → 0 Ready → 1 |
| I/O-7 | Cache-R/B | Busy → 0 Ready → 1 |
| I/O-8 | — | — |

Table 6 below indicates example status read time data outputs containing no PASS/FAIL status.

TABLE 6

|  | Status | Output |
|---|---|---|
| I/O-1 | — | — |
| I/O-2 | — | — |
| I/O-3 | — | — |
| I/O-4 | — | — |
| I/O-5 | — | — |
| I/O-6 | True-R/B | Busy → 0 Ready → 1 |
| I/O-7 | Cache-R/B | Busy → 0 Ready → 1 |
| I/O-8 | — | — |

That is, when first and second operations for which PASS/FAIL results are held in the chip are performed in succession, the NAND-cell EEPROM of the first embodiment allows the PASS/FAIL results to be output to the outside of the chip, which increases the convenience of control outside the chip.

In addition, the NAND-cell EEPROM described above allows a first operation of, say, programming data and a second operation of, say, inputting program data to be performed concurrently. To this end, the EEPROM is adapted to output data representing whether or not the first operation is being executed, e.g., True-R/B, and data representing whether or not the second operation is executable when the first operation is in execution, e.g., Cache-R/B.

Thus, a program data input operation can be performed concurrently with a data program operation. Thereby, the time required by the entire data program sequence is determined by the longer one of the time required by data input operations and the time required by data program operations. The operations shorter in required time have no influence on the time required by the entire sequence. Thus, the time required by the entire data program sequence can be reduced, allowing a fast data programming function to be implemented.

To perform first and second operations whose PASS/FAIL results are held in the chip after the termination thereof and, when the first and second operations are performed in succession, to output both of the PASS/FAIL results of the first and second operations to the outside of the chip, a semiconductor integrated circuit is simply required to have the following circuits:

a PASS/FAIL decision circuit (14) that decides the result of an immediately preceding operation in the integrated circuit and produces a PASS/FAIL signal;

a PASS/FAIL holding circuit (15) that is responsive to the PASS/FAIL decision circuit to separately hold the PASS/FAIL result of each of the first and second operations performed successively in the integrated circuit; and a data input/output buffer (4) that outputs the PASS/FAIL results of the first and second operations held in the PASS/FAIL result holding circuit to the outside of the chip.

Further, a cumulative PASS/FAIL result holding circuit may be provided which cumulatively holds the PASS/FAIL results of the first and second successive operations. In this case, The cumulative PASS/FAIL result of the two operations held in the cumulative PASS/FAIL result holding circuit and/or the PASS/FAIL result of each of the two operations held in the PASS/FAIL holding circuit can be output to the outside of the chip via the output circuit.

Figure 18:
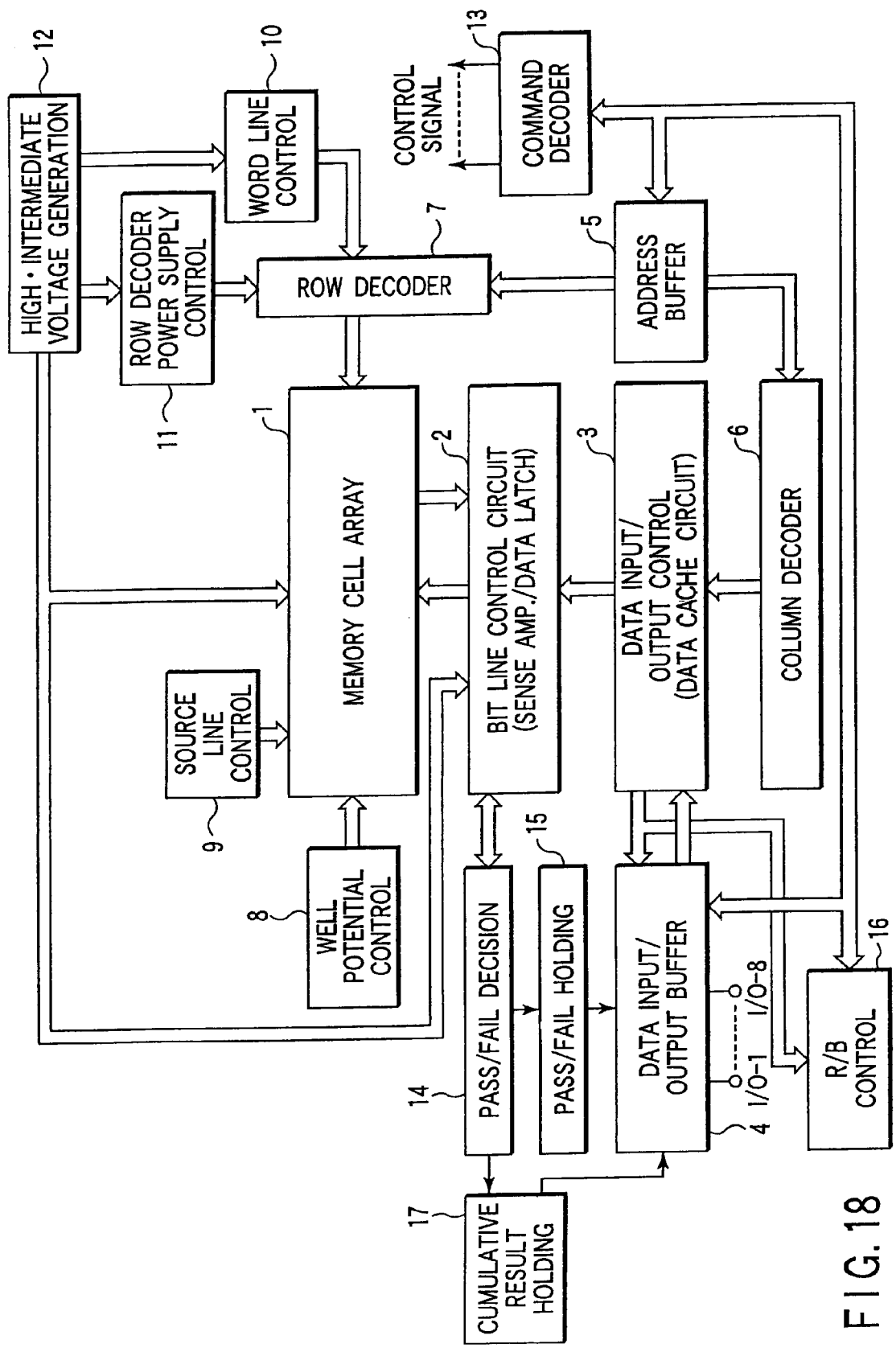
FIG. 18 is a block diagram of a NAND-cell EEPROM according to a second embodiment of the present invention.

FIG. 18 is a block diagram of a NAND-cell EEPROM which is equipped with the aforementioned cumulative PASS/FAIL result holding circuit in accordance with the a second embodiment of the present invention.

This EEPROM differs from the EEPROM of FIG. 4 only in that the cumulative PASS/FAIL result holding circuit 17 is added. This circuit, which is connected to the PASS/FAIL decision circuit 14 and the data input/output buffer 4, accumulates the PASS/FAIL results for more than one operation produced by the PASS/FAIL decision circuit 14. The cumulative PASS/FAIL result is sent to the data input/output buffer 4 and then output to the outside of the chip through the I/O pad I/O-3 as indicated in Table 5.

Further, a cumulative data holding circuit which separately holds more than one cumulative PASS/FAIL result output from the cumulative PASS/FAIL result holding circuit 17 may be provided. In such a case, the cumulative data held in the cumulative data holding circuit and/or the PASS/FAIL result of each of the two operations held in the PASS/FAIL holding circuit can be output to the outside of the chip via the output circuit.

FIG. 19 is a block diagram of a NAND-cell EEPROM which is equipped with the aforementioned cumulative data holding circuit in accordance with the a third embodiment of the present invention.

This EEPROM has the cumulative data holding circuit 18 added to the EEPROM of FIG. 18. This circuit, which is connected to the cumulative PASS/FAIL result holding circuit 17 and the data input/output buffer 4, separately accumulates each of the cumulative PASS/FAIL results output from the cumulative PASS/FAIL result holding circuit 17. The cumulative PASS/FAIL results are sent to the data input/output buffer 4 and then output to the outside of the chip through one of the I/O pads I/O-1 through I/O-8.

Although the embodiments have been described as using background operations to program data, the present invention is effective in using background operations to read data.

Figure 20:
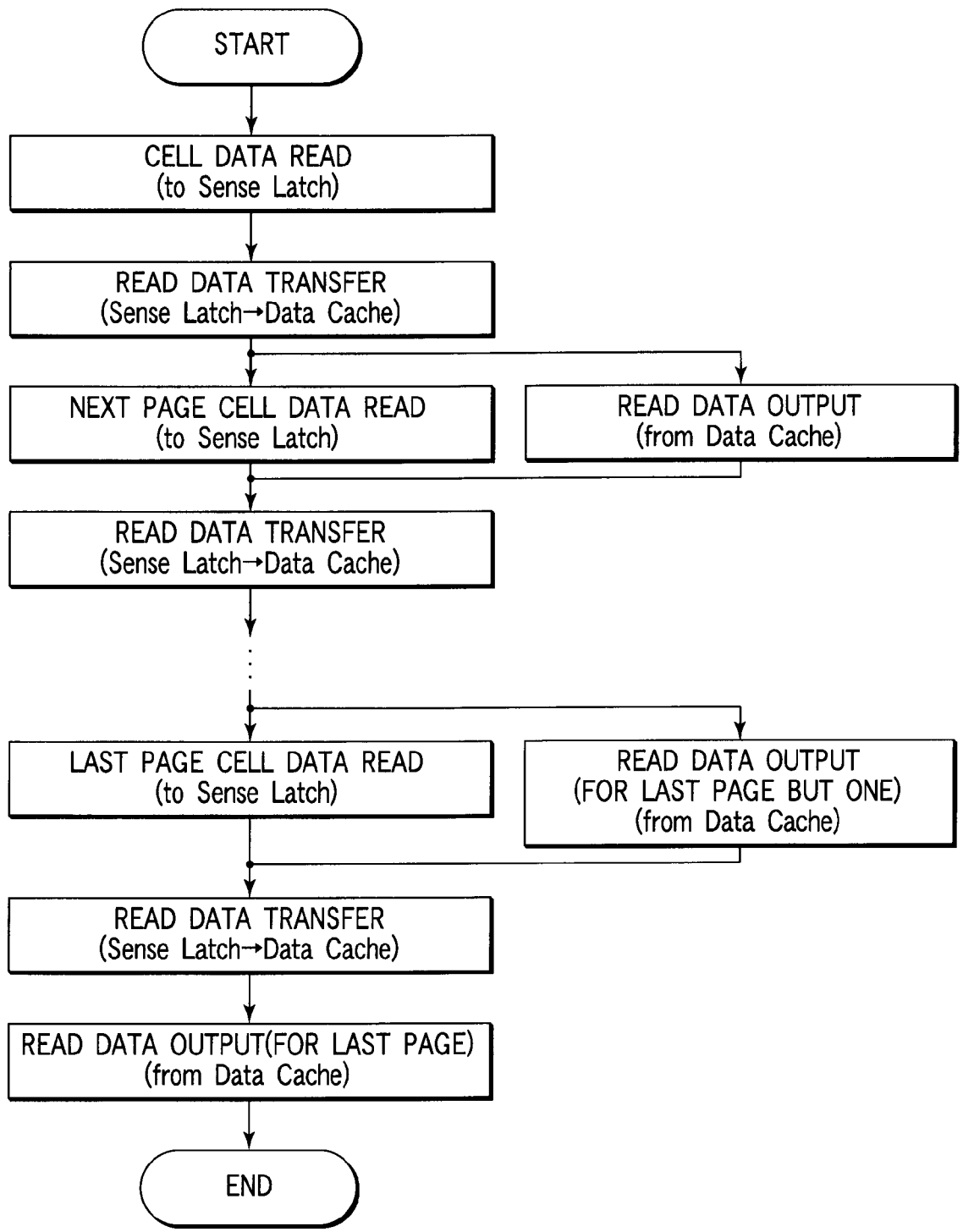
FIG. 20 is a flowchart illustrating an algorithm for a data program sequence in the memory of FIG. 8.

FIG. 20 is a flowchart illustrating an algorithm for a data read sequence when the present invention is applied to a data read operation in the circuit of FIG. 8.

Here, when two or more pages are read in succession, a cell data read operation and a read data output operation are performed concurrently.

When each of the second page and later is read, a cell data read operation is performed concurrently with a data output operation for the immediately preceding page.

Thus, the time required by the entire data read sequence is determined only by the longer one of the time required by data read operations and the time required by data output operations. The operations shorter in required time have no influence on the time required by the entire sequence.

In FIG. 20, the time required by each read data transfer operation is of the order of 2 to 3 µs, the time required by each cell data read operation is of the order of 25 to 50 µs, and the time required by each read data output operation is of the order of 25 to 100 µs. Thus, the time required by the data read sequence is determined by the time required to read cell data or the time required to output the data read, whichever the longer.

In contrast, with the conventional algorithm shown in FIG. 3, the time required by the entire data read sequence is determined by the sum of the time required by cell data read operations and the time required by read data output operations. The algorithm of FIG. 20 can therefore implement a faster data read sequence than the conventional algorithm.

FIGS. 21A through 21F schematically show the data read operation by the circuit of FIG. 8 when the algorithm of FIG. 20 is used.

Figure 22A:
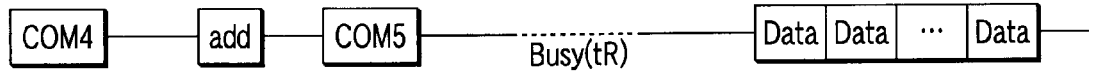
FIGS. 22A, 22B and 22C show conventional and in the first to third embodiments data read sequences.

FIG. 22A schematically shows a conventional data read operation control method. In this case, a data read operation is performed in the foreground on each of the pages.

Figure 22B:
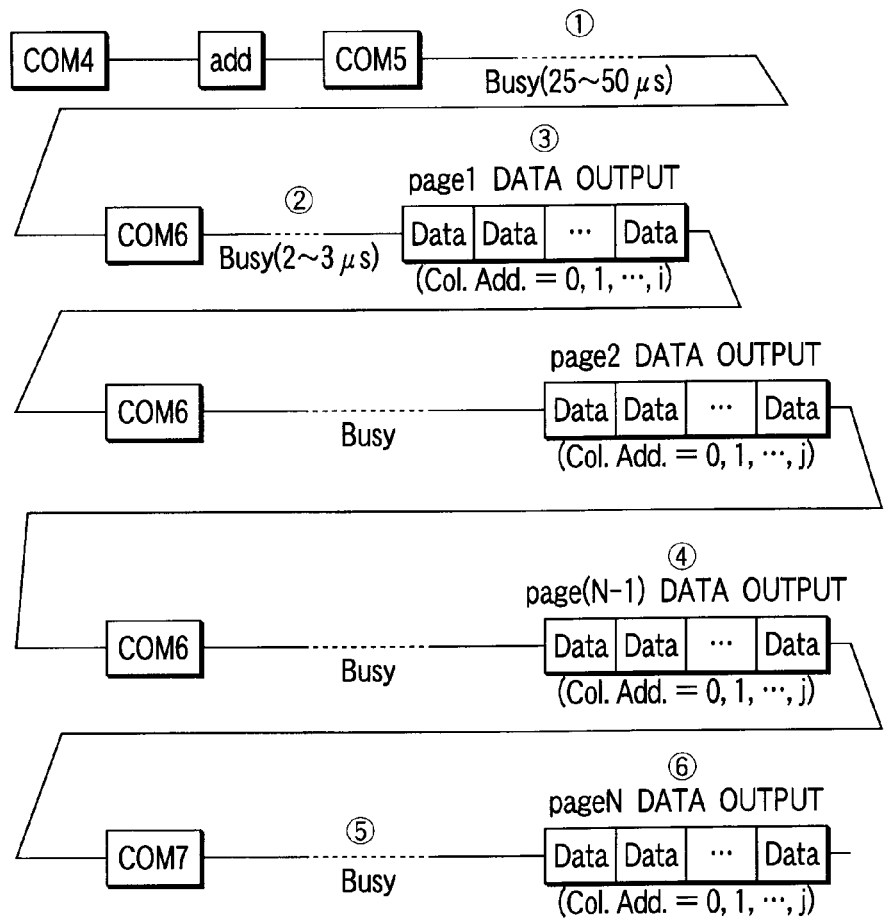

FIG. 22B schematically shows a control method for the data read operation shown in FIGS. 21A through 21F. The operations in intervals ① to ⑥ in FIG. 22B corresponds to the operations of FIGS. 21 to 21F, respectively.

As can be seen from FIGS. 21A through 21F and 22B, the data read operation for the first page (the operation in interval ①) uses the same commands COM4 and COM5 as in the conventional data read operation and is performed in the foreground.

Each of the cell data read operations (in intervals ② to ⑥) subsequent to the first entry of command COM6 is a background operation and is performed concurrently with a data output operation.

The initiation command for a background read operation is COM6. After entry of this command, a read data transfer (sense latch→data cache) is first performed with the busy status output, then a data read operation for the next page is started and the ready status is output.

Figure 22C:
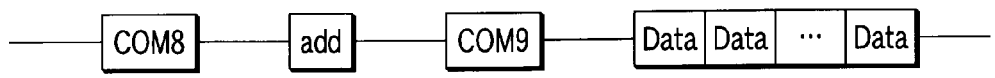

The read data are output in sequence starting with the column 0 address. A specific column address, if desired, can be designated during read data output operation by inputting it between commands COM8 and COM9 as shown in FIG. 22C.

For the last page in the data read sequence, there is no need to reading cell data in the next page at the time the last page data is output; thus, it is effective to use a command COM7 dedicated to read data transfer which involves no cell data read operation. The use of the command COM7 involves no extra cell data read operation, allowing the operation-required time, i.e., the busy state time, to be reduced.

FIGS. 23A through 23F shows the ready/busy states for data read operations when the control method of FIG. 22B is used. In these figures, address/data inputs are omitted in portions in which command inputs are described only for the purpose of simplifying illustration.

The signal "Cache-R/B" in FIGS. 23A through 23F indicates the aforementioned read/busy states, for example, the ready/busy states in FIG. 22B and usually corresponds to the chip ready/busy states output from one of the I/O pads I/O-1 to I/O-8 in FIG. 4. The signal "True-R/B" represents the in-chip operating states including the background operations and always assumes the busy state during each background operation.

Usually, no PASS/FAIL status is output for data read operations; thus, data outputs at status read time become as shown in Table 6.

In the L1 interval in FIG. 23A, a data read operation is performed independently, which corresponds to a foreground operation. In this case, the two signals Cache-R/B and True/R/B are coincident in state with each other.

FIGS. 23B, 23D and 23E illustrate the read operation intervals and the busy signal states when two data read operations are performed successively and a second-operation start command is input after the termination of the first operation.

FIGS. 23C and 23F illustrate the read operation intervals and the busy signal states when two data read operations are performed successively and a second-operation start command is input during the first program operation.

From FIGS. 23A through 23F it can be seen that, when background operations are involved, the ready/busy states vary with the input times of operation start commands.

Valid commands, inhibit commands and ignore commands at the time of data read background operation execution (when the Cache R/B is at "1" (ready) and the True R/B is at "0" (busy)) are as follows: The valid commands include reading-related commands, such as COM6, COM8 and COM9, a reset command, and status read commands to output the ready/busy state and the PASS/FAIL state. The inhibit commands and ignore commands, which are other than the valid commands, include programming-related commands and erasing-related commands.

A chip ID output command may be classified under either of valid or inhibit commands. In order to make circuit arrangements straightforward, it should preferably be taken into the inhibit commands.

Figure 24A:
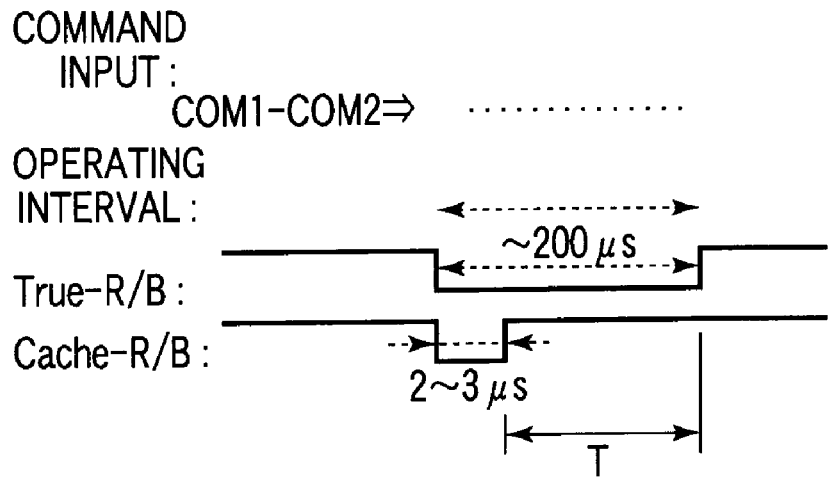
FIGS. 24A and 24B are timing diagrams illustrating the background operation interval in the NAND cell EEPROM of FIG. 4.
Figure 24B:
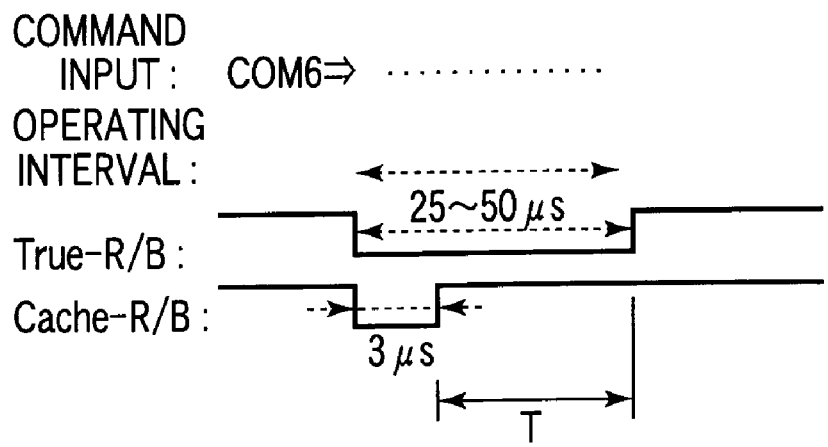

FIGS. 24A and 24B show the times of inputting valid and inhibit commands while the NAND-cell EEPROM is in background operation.

As shown in FIG. 24A, in data program operation, valid commands in the interval T between the signal Cache R/B changing from the busy state to the ready state and the signal True R/B changing from the busy state to the ready state are programming-related commands, such as COM1, COM2 and COM3, status read commands COMS, and reset commands. Other commands are inhibited or ignored.

As shown in FIG. 24B, at data read time, valid commands in the interval T between the signal Cache R/B changing from the busy state to the ready state and the signal True R/B changing from the busy state to the ready state are reading-related commands, such as COM1, COM2 and COM3, status read commands COMS, and reset commands. Other commands are inhibited or ignored.

When the last page is read from in the operation of FIG. 24B, a single read operation is enough for the last page even if the read command COM6 is input in succession because there is no page to be read next.

Thus, when the read command COM6 is input successively for the last page, an approach can be adopted by which read operations are omitted when the command is input on and after a second time and the busy state is output during a short time of, say, 2 to 3 µs or only a read data transfer operation is performed. In this case, the data read operation can be omitted, allowing the operation time, i.e., the busy interval to be reduced.

The present invention is not restricted to the embodiments described so far and may be embodied or practiced in still other ways.

For example, although the embodiments have been described as the number of series-connected memory cells in each NAND cell being eight, the principles of the present invention is also applicable to the case where the number of memory cells is 1, 2, 4, 16, 32, or 64.

In the embodiment descried above, the data cache circuits and sense latch circuits are provided, each for two bit lines. Nonetheless, each data cache and each sense latch circuit may be provided for one bit line, four bit lines, eight bit lines or 16 bit lines. In this case, too, the present invention is useful and advantageous.

Although the embodiments have been described in terms of a NAND-cell EEPROM, the principles of the present invention are also applicable to other devices, such as a NOR-cell EEPROM, a DINOR-cell EEPROM, an AND-cell EEPROM, a NOR-cell EEPROM with select transistors, etc.

Figure 25:
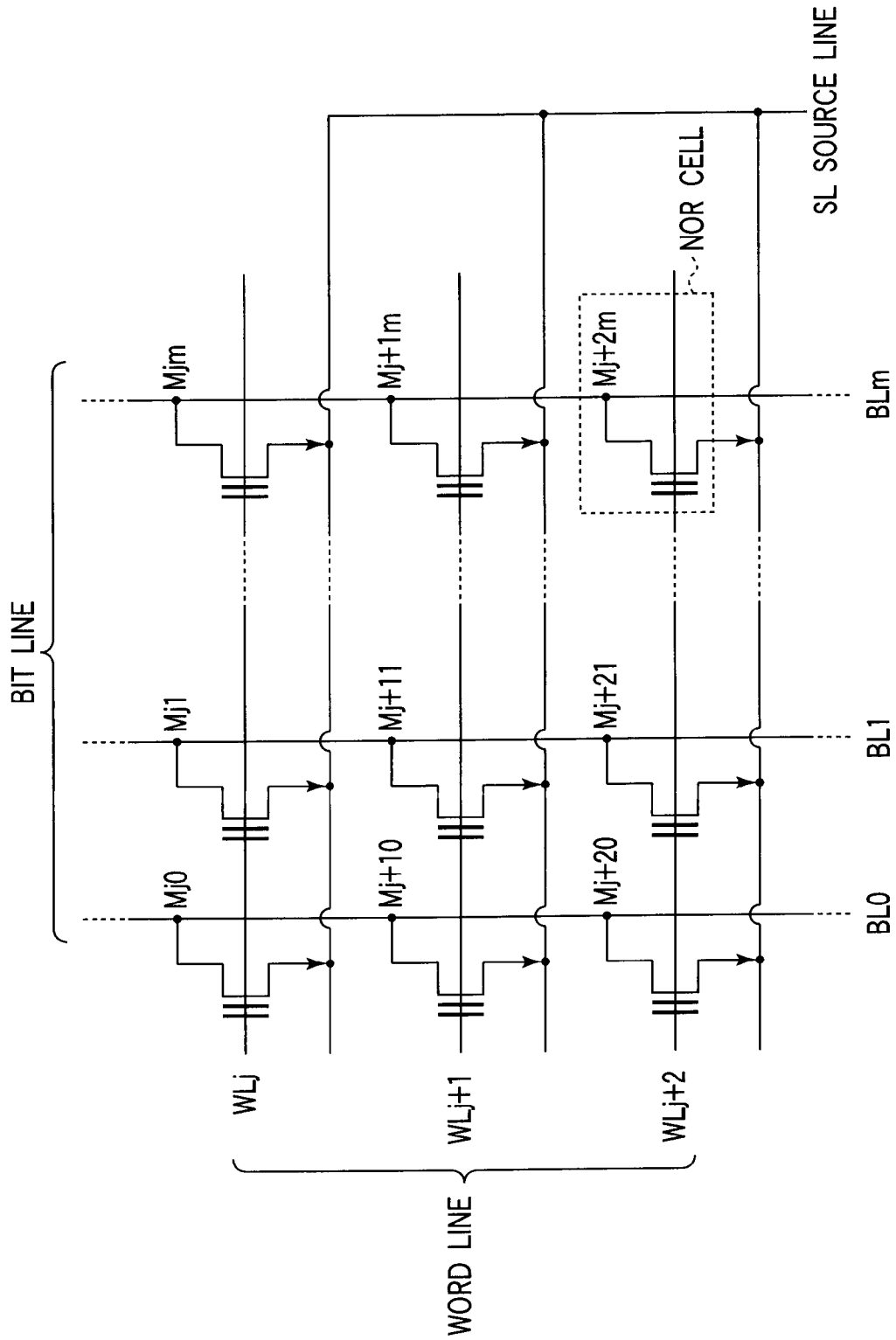
FIG. 25 shows an equivalent circuit of a portion of the memory cell array of a NOR cell EEPROM.
Figure 29:
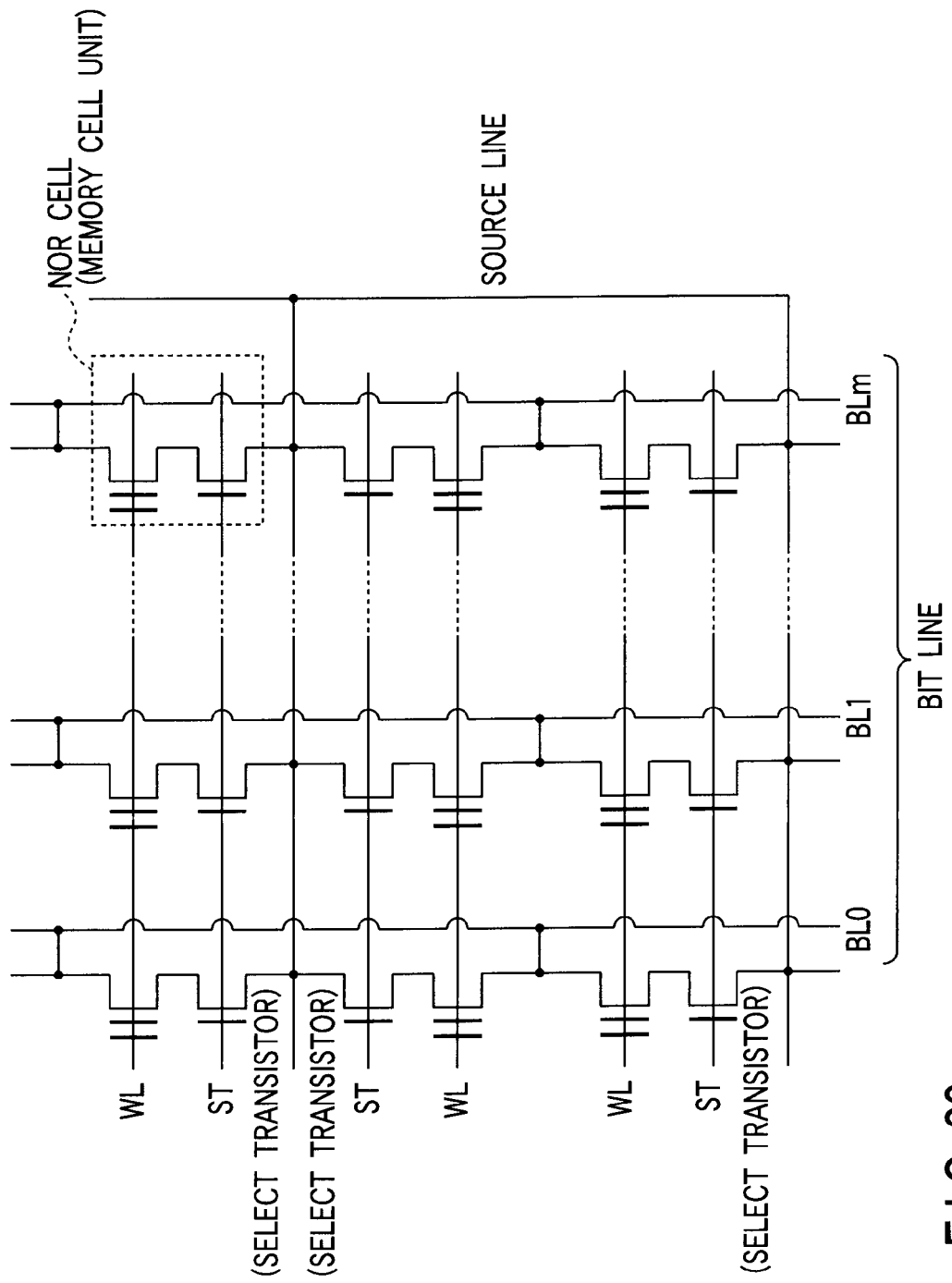
FIG. 29 shows an equivalent circuit of a portion of the memory cell array of another example of a NOR cell EEPROM with select transistors.

For example, an equivalent circuit of part of the memory cell array of a NOR-cell EEPROM is illustrated in FIG. 25. An equivalent circuit of part of the memory cell array of a DINOR-cell EEPROM is illustrated in FIG. 26. An equivalent circuit of part of the memory cell array of an AND-cell EEPROM is illustrated in FIG. 27. And an equivalent circuit of part of the memory cell array of a NOR-cell EEPROM with select transistors is illustrated in FIGS. 28 and 29.

The DINOR-cell EEPROM is described in detail in H. Onoda et al., IEDM Tech. Digest, 1992, pp. 599-602. The AND-cell EEPROM is described in detail in H. Kume et al., IEDM Tech. Digest, 1992, pp. 991-993.

Although the embodiments have been described in terms of a semiconductor storage device having an electrically rewritable nonvolatile memory cell array. The principles of the present invention are also applicable to other semiconductor storage devices and other semiconductor integrated circuits.

The present invention may be practiced or embodied in still other ways without departing from the scope and spirit thereof.

Additional advantages and modifications will readily occur to those skilled in the art. Therefore, the invention in its broader aspect is not limited to the specific details and representative embodiments shown and described herein. Accordingly, further various modifications may be made without departing from the spirit or scope of the general inventive concept as defined by the appended claims and their equivalents.

What is claimed is:

1. A semiconductor memory device comprising:
a plurality of data cache circuits configured to hold data temporarily;
a plurality of sense latch circuits connected to the plurality of data cache circuits and configured to sense and latch data read from a plurality of memory cells in program verify operation; and
a control circuit configured to perform a first operation,
wherein the first operation is an operation to sense and latch data of a selected memory cell into a corresponding one of the plurality of sense latch circuits or one of the plurality of data cache circuits, the first operation is performed by inputting a first command or a first command sequence, and a first ready/busy signal goes to a busy status when the data of the selected memory cell is latched into one of the plurality of data cache circuits.

2. The semiconductor memory device according to claim 1, wherein the data of the selected memory cell is output from the plurality of data cache circuits after the data of the selected memory cell is latched into one of the plurality of data cache circuits.

3. The semiconductor memory device according to claim 1, wherein the plurality of data cache circuits are connected to data input/output lines.

4. The semiconductor memory device according to claim 1, wherein the first command sequence includes an address input from outside the semiconductor memory device to the semiconductor memory device.

5. The semiconductor memory device according to claim 1, wherein the first command sequence does not include an address input from outside the semiconductor memory device to the semiconductor memory device.

6. The semiconductor memory device according to claim 1, wherein each of the plurality of sense latch circuits is connected to only two bit lines.

7. The semiconductor memory device according to claim 1, wherein each of the plurality of sense latch circuits is connected to only one bit line.

8. The semiconductor memory device according to claim 1, wherein the first ready/busy signal is a cache-R/B signal.

9. The semiconductor memory device according to claim 1, wherein the first ready/busy signal is output from a ready/busy status output pad except for an input/output pad.

10. The semiconductor memory device according to claim 1, wherein the ready/busy signal which is output from a ready/busy status output pad includes the same ready/busy signal as the cache-R/B signal.

11. The semiconductor memory device according to claim 1, wherein the first operation is a reading operation.

12. The semiconductor memory device according to claim 1, wherein data input operation from outside of a chip and data output operation to outside of a chip are inhibited or disabled as long as the first ready/busy signal is in a busy status.

13. The semiconductor memory device according to claim 1, wherein each of the plurality of memory cells is a nonvolatile memory cell.

14. The semiconductor memory device according to claim 1, wherein two or more of the plurality of memory cells compose a memory cell unit, and the memory cells included in the memory cell unit are connected in series.

15. The semiconductor memory device according to claim 1, wherein the plurality of sense latch circuits are configured to sense and latch data read from the plurality of memory cells in a reading operation.

16. A semiconductor memory device comprising:
a plurality of data cache circuits configured to hold data temporarily;
a plurality of sense latch circuits connected to the plurality of data cache circuits and configured to sense and latch data read from a plurality of memory cells in program verify operation; and
a control circuit configured to perform a first operation and a data transfer operation,
wherein the first operation is an operation to sense and latch data of a selected memory cell into a corresponding one of the plurality of sense latch circuits, the data transfer operation is an operation to transfer data latched in the plurality of sense latch circuits to the plurality of data cache circuits and to be performed automatically after the first operation terminates, the first operation is performed by inputting a first command or a first command sequence, and a first ready/busy signal goes to a busy status during the data transfer operation.

17. The semiconductor memory device according to claim 16, wherein a first ready/busy signal goes to a busy status before the data transfer operation terminates, and the first ready/busy signal goes to a ready status after the data transfer operation terminates.

18. The semiconductor memory device according to claim 16, wherein a second ready/busy signal goes to a busy status during the data transfer operation, the second ready/busy signal goes to a busy status during the first operation, and the first ready/busy signal goes to a ready status during the first operation.

19. The semiconductor memory device according to claim 18, wherein the second ready/busy signal is a true-R/B signal, and the first ready/busy signal is a cache-R/B signal.

20. The semiconductor memory device according to claim 16, wherein the first operation is a reading operation.

21. The semiconductor memory device according to claim 16, wherein two or more of the plurality of memory cells compose a memory cell unit, and the memory cells included in the memory cell unit are connected in series.

22. The semiconductor memory device according to claim 16, wherein the plurality of sense latch circuits are configured to sense and latch data read from the plurality of memory cells in a reading operation.

23. The semiconductor memory device according to claim 16, wherein each of the plurality of sense latch circuits is connected to only two bit lines.

24. The semiconductor memory device according to claim 16, wherein each of the plurality of sense latch circuits is connected to only one bit line.

* * * * *